(12) United States Patent
Park et al.

(10) Patent No.: US 11,776,913 B2
(45) Date of Patent: Oct. 3, 2023

(54) SEMICONDUCTOR PACKAGE AND A PACKAGE-ON-PACKAGE INCLUDING THE SAME

(71) Applicant: SAMSUNG ELECTRONICS CO., LTD., Suwon-si (KR)

(72) Inventors: Hwanpil Park, Hwaseong-si (KR); Dongho Kim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 164 days.

(21) Appl. No.: 17/360,730

(22) Filed: Jun. 28, 2021

(65) Prior Publication Data

US 2021/0407911 A1 Dec. 30, 2021

(30) Foreign Application Priority Data

Jun. 29, 2020 (KR) .......................... 10-2020-0079525

(51) Int. Cl.
*H01L 23/48* (2006.01)
*H01L 23/538* (2006.01)
*H01L 23/492* (2006.01)

(52) U.S. Cl.
CPC ........ *H01L 23/5384* (2013.01); *H01L 23/492* (2013.01); *H01L 23/5386* (2013.01)

(58) Field of Classification Search
CPC ............. H01L 23/5386; H01L 23/5384; H01L 23/5389; H01L 23/3107; H01L 2224/0233
USPC .................................................. 257/773, 786
See application file for complete search history.

(56) References Cited

U.S. PATENT DOCUMENTS

| | | | |
|---|---|---|---|
| 5,608,262 A * | 3/1997 | Degani ............... | H01L 23/4985 257/E23.008 |
| 6,054,337 A * | 4/2000 | Solberg ............... | H01L 25/0657 257/E21.705 |
| 6,121,689 A * | 9/2000 | Capote .............. | H01L 23/49883 257/E21.511 |
| 7,800,212 B2 | 9/2010 | Yoon et al. | |
| 7,989,950 B2 * | 8/2011 | Park ..................... | H01L 25/105 257/E33.059 |
| 9,337,135 B2 | 5/2016 | Lii et al. | |
| 10,361,177 B2 | 7/2019 | Kim et al. | |
| 10,446,530 B2 | 10/2019 | Mortensen et al. | |
| 10,756,075 B2 | 8/2020 | Hong et al. | |
| 2012/0273960 A1 * | 11/2012 | Park .................. | H01L 23/49827 257/774 |
| 2018/0151549 A1 | 5/2018 | Wu | |
| 2018/0315740 A1 | 11/2018 | Im et al. | |
| 2018/0374833 A1 | 12/2018 | Wong et al. | |
| 2019/0189667 A1 * | 6/2019 | Jung ................. | H01L 27/14618 |
| 2020/0321301 A1 * | 10/2020 | Mitarai ............... | H01L 23/3107 |

FOREIGN PATENT DOCUMENTS

KR 10-2019-0133907 12/2019

* cited by examiner

*Primary Examiner* — Nitin Parekh
(74) *Attorney, Agent, or Firm* — F. Chau & Associates, LLC

(57) ABSTRACT

A semiconductor package including: a first wiring structure; a semiconductor chip disposed on the first wiring structure; a second wiring structure disposed on the semiconductor chip and including a cavity; and a filling member between the first wiring structure and the second wiring structure and in the cavity, wherein an uppermost end of the filling member and an uppermost end of the second wiring structure are located at the same level.

20 Claims, 23 Drawing Sheets

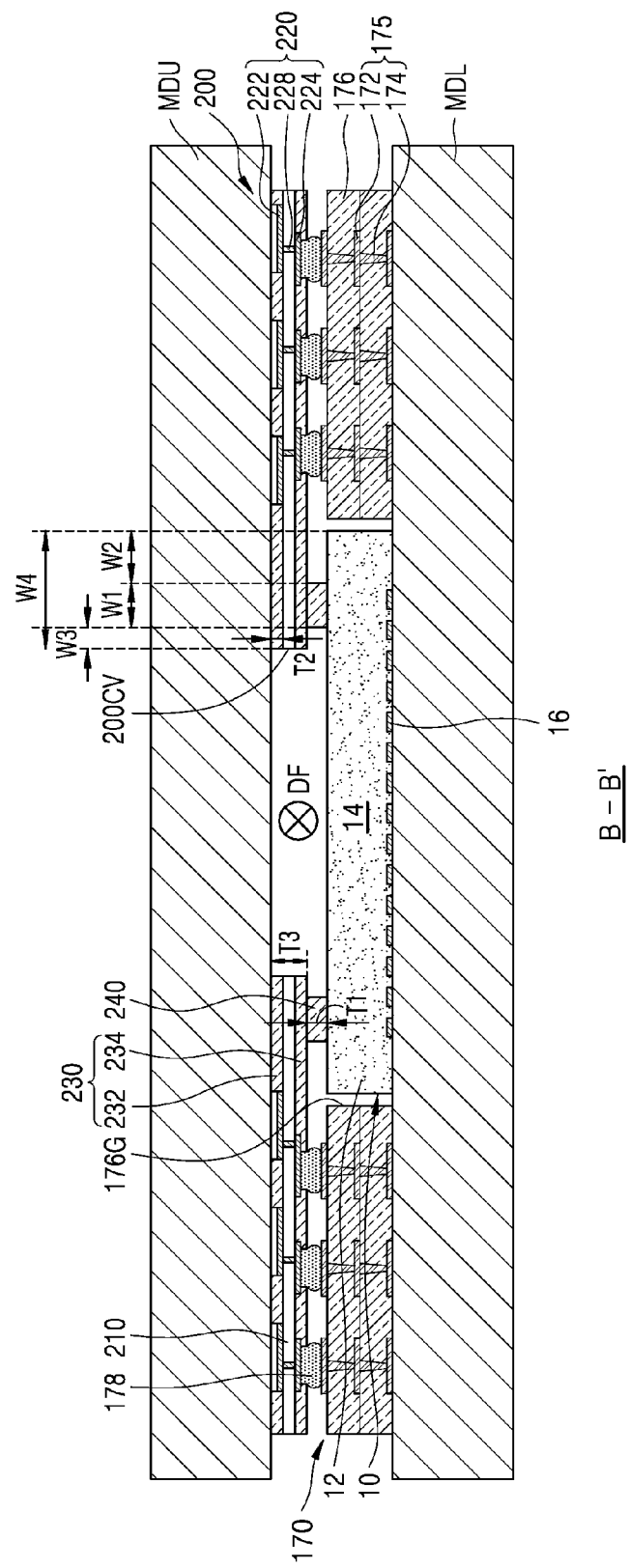

SEMICONDUCTOR PACKAGE AND A PACKAGE-ON-PACKAGE INCLUDING THE SAME

CROSS-REFERENCE TO RELATED APPLICATION

This application claims priority under 35 U.S.C. § 119 to Korean Patent Application No. 10-2020-0079525, filed on Jun. 29, 2020, in the Korean Intellectual Property Office, the disclosure of which is incorporated by reference herein in its entirety.

TECHNICAL FIELD

The inventive concept relates to a semiconductor package and a package-on-package (PoP) including the same, and more particularly, to a fan-out semiconductor package and a PoP including the same.

DISCUSSION OF RELATED ART

As electronic devices are becoming more compact and lightweight, high integration of semiconductor devices, which are key components of electronic devices, is increasingly required. In addition, as mobile products continue to develop and become ubiquitous, features such as miniaturization and multi-functionality are desired.

Accordingly, to provide a multifunctional semiconductor package, a package-on-package (PoP) type semiconductor package has been developed. A PoP type semiconductor package may include semiconductor packages having different functions stacked on one semiconductor package.

SUMMARY

According to an exemplary embodiment of the inventive concept, there is provided a semiconductor package including: a first wiring structure; a semiconductor chip disposed on the first wiring structure; a second wiring structure disposed on the semiconductor chip and including a cavity; and a filling member between the first wiring structure and the second wiring structure and in the cavity, wherein an uppermost end of the filling member and an uppermost end of the second wiring structure are located at the same level.

According to an exemplary embodiment of the inventive concept, there is provided a semiconductor package including: a support wiring structure including a plurality of first base insulating layers and a plurality of first wiring patterns; a semiconductor chip disposed on the support wiring structure and electrically connected to a first portion of the plurality of first wiring patterns; a cover wiring structure disposed on the semiconductor chip and including at least one second base insulating layer, a plurality of second wiring patterns, an upper solder resist layer and a lower solder resist layer covering an upper surface and a lower surface of the at least one second base insulating layer, a plurality of solder resist patches disposed between the lower solder resist layer and the semiconductor chip and having a first width, and a cavity overlapping the semiconductor chip in a vertical direction and having an area less than an area of the semiconductor chip; a filling member surrounding side surfaces of the plurality of solder resist patches and including a filling protrusion filling a space between the support wiring structure and the cover wiring structure and the cavity; and a plurality of connection structures penetrating the filling member and connecting a second portion of the plurality of first wiring patterns and the plurality of second wiring patterns, wherein an upper surface of the filling protrusion and an upper surface of the upper solder resist layer are coplanar.

According to an exemplary embodiment of the inventive concept, there is provided a package-on-package (PoP) including: a first semiconductor package including a support wiring structure including a plurality of first base insulating layers and a plurality of first wiring patterns; a first semiconductor chip disposed on the support wiring structure; a cover wiring structure disposed on the first semiconductor chip and including at least one second base insulating layer, a plurality of second wiring patterns, a plurality of solder resist patches contacting an upper surface of the semiconductor chip and having a first width, and a cavity; a filling member filling between the support wiring structure and the cover wiring structure and the cavity and having an uppermost end located at the same vertical level as an uppermost end of the cover wiring structure; and a plurality of connection structures penetrating the filling member and electrically connecting the plurality of first wiring patterns and the plurality of second wiring patterns; and a second semiconductor package including a second semiconductor chip; and a package connection terminal attached to a part of the plurality of second wiring patterns to electrically connect the second semiconductor chip and the first semiconductor package and stacked on the first semiconductor package, wherein the cavity has a planar area less than a planar area of the first semiconductor chip and overlaps the semiconductor chip in a vertical direction, and wherein at least one of the plurality of solder resist patches is spaced apart from an edge of the first semiconductor chip by a second width greater than the first width.

According to an exemplary embodiment of the inventive concept, there is provided a semiconductor package including: a first wiring structure; a second wiring structure, wherein the second wiring structure includes an opening; a semiconductor chip disposed between the first and second wiring structures, wherein the opening overlaps the semiconductor chip; a filling portion disposed between the first and second wiring structures, inside the opening and between the semiconductor chip and the second wiring structure; and a solder resist pattern disposed between the semiconductor chip and the second wiring structure.

BRIEF DESCRIPTION OF THE DRAWINGS

The above and other features of the inventive concept will be more clearly understood by describing in detail exemplary embodiments thereof in conjunction with the accompanying drawings in which:

FIGS. 7A, 7B, 7C and 7D are cross-sectional views illustrating a method of manufacturing a semiconductor package according to exemplary embodiments of the inventive concept;

DETAILED DESCRIPTION OF THE EMBODIMENTS

Figure 1A:
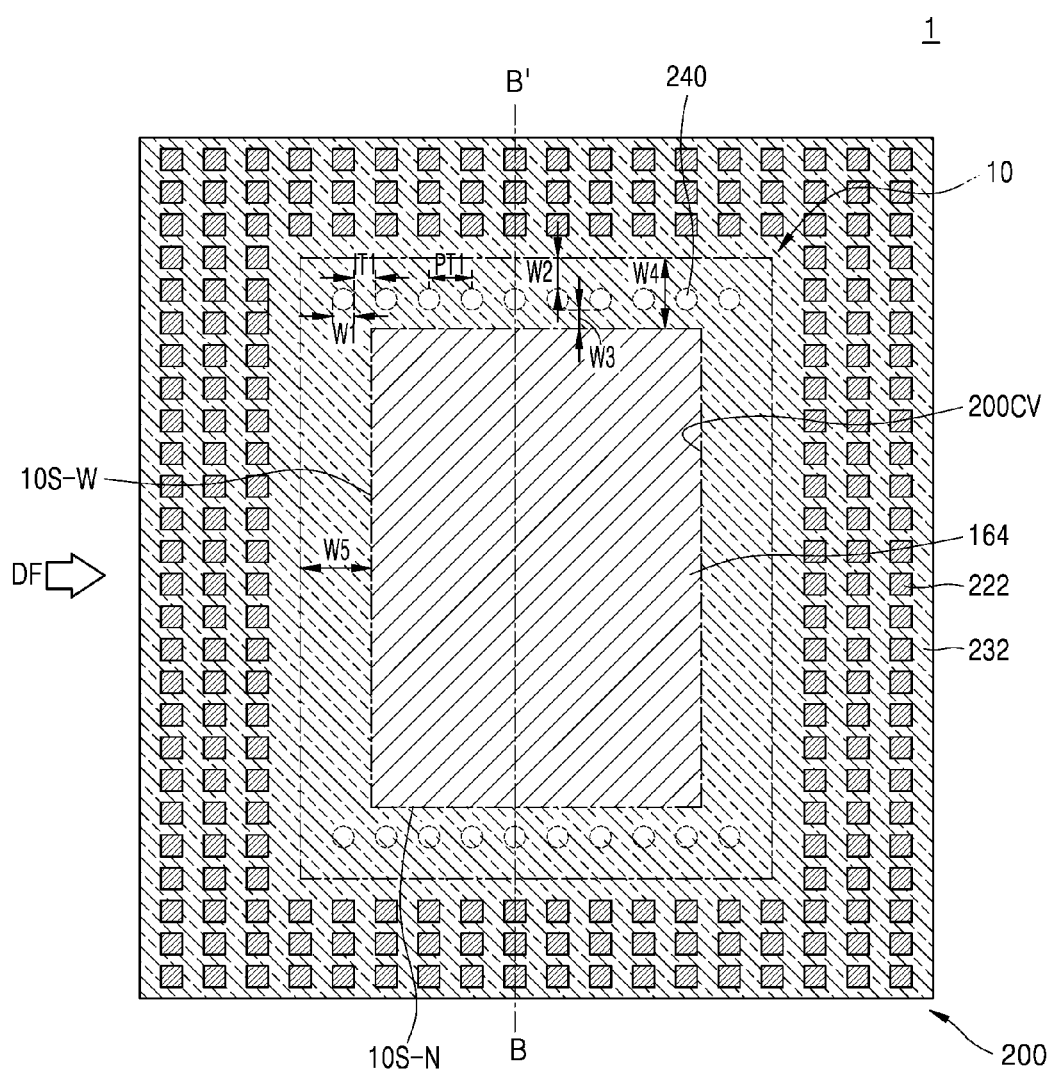
FIG. 1A is a top view of a semiconductor package according to exemplary embodiments of the inventive concept.
Figure 1B:
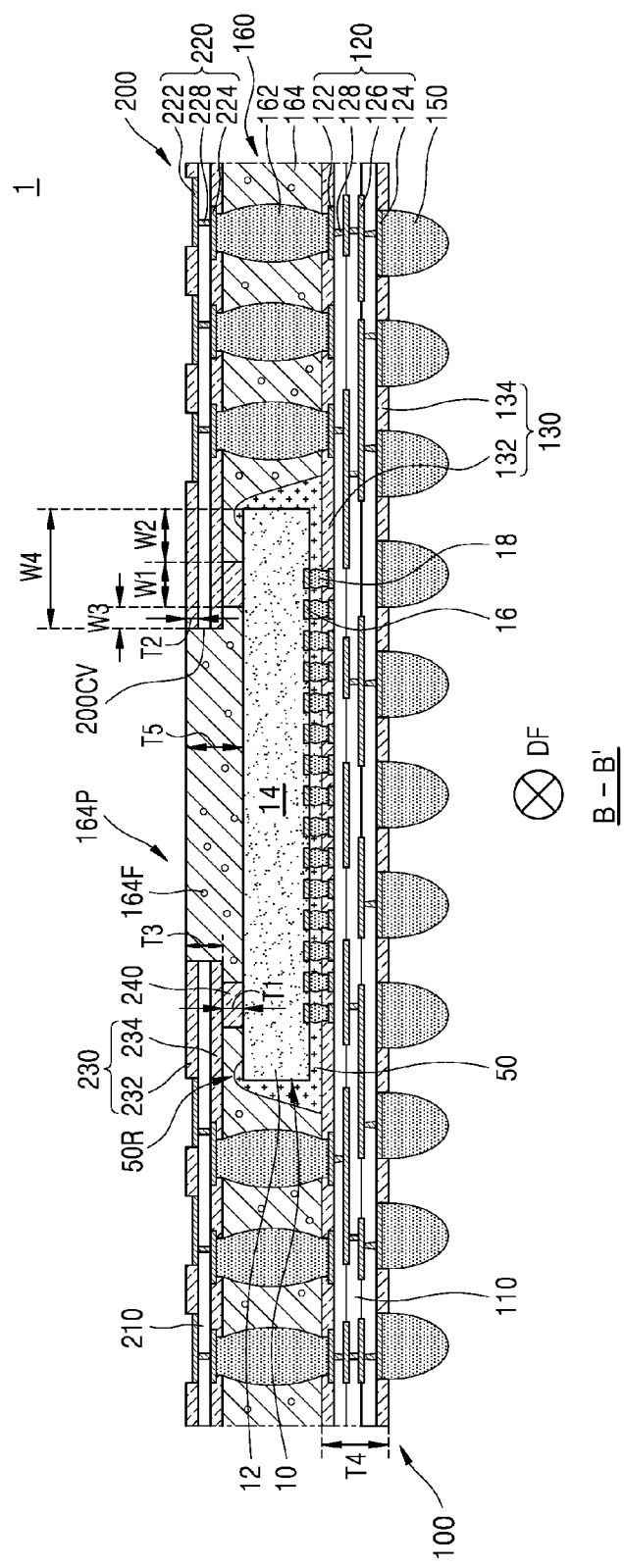
FIG. 1B is a cross-sectional view of a semiconductor package according to exemplary embodiments of the inventive concept.

FIG. 1A is a top view of a semiconductor package 1 according to exemplary embodiments of the inventive concept, and FIG. 1B is a cross-sectional view of the semiconductor package 1 according to exemplary embodiments of the inventive concept. FIG. 1B is a cross-sectional view taken along line B-B' of FIG. 1A.

Referring to FIGS. 1A and 1B, the semiconductor package 1 may include a support wiring structure 100, an expanded layer 160 disposed on the support wiring structure 100, a semiconductor chip 10 disposed in the expanded layer 160, and a cover wiring structure 200 disposed on the expanded layer 160. The expanded layer 160 may surround the semiconductor chip 10. In FIGS. 1A and 1B, the semiconductor package 1 includes one semiconductor chip 10, but this is merely exemplary and the inventive concept is not limited thereto. In some embodiments, the semiconductor package 1 may include a plurality of semiconductor chips 10.

The semiconductor package 1 may be a fan out semiconductor package in which each of a horizontal width and a plane area of the support wiring structure 100 and a horizontal width and a plane area of the cover wiring structure 200 has values greater than those of the horizontal width and the plane area of the footprint of the semiconductor chip 10. For example, when the semiconductor package 1 includes one semiconductor chip 10, each of the horizontal width and the plane area of the support wiring structure 100 and the horizontal width and the plane area of the cover wiring structure 200 has values greater than those of the horizontal width and the plane area of one semiconductor chip 10. In some embodiments, the horizontal width and the plane area of the support wiring structure 100 and the horizontal width and the plane area of the cover wiring structure 200 may have the same value. For example, the horizontal width of the support wiring structure 100 may be the same as the horizontal width of the cover wiring structure 200. In some embodiments, side surfaces of each of the support wiring structure 100, the expanded layer 160, and the cover wiring structure 200 may be coplanar.

The support wiring structure 100 may be referred to as a lower wiring structure or a first wiring structure, and the cover wiring structure 200 may be referred to as an upper wiring structure or a second wiring structure.

The support wiring structure 100 may be, for example, a printed circuit board (PCB), a ceramic substrate, a package manufacturing wafer, or an interposer. In some embodiments, the support wiring structure 100 may be a multi-layer PCB. When the support wiring structure 100 is the PCB, the support wiring structure 100 may also be referred to as a support PCB, a lower PCB, or a first PCB.

The support wiring structure 100 may include at least one first base insulating layer 110 and a plurality of first wiring patterns 120. The first base insulating layer 110 may include at least one material selected from phenol resin, epoxy resin, and polyimide. The first base insulating layer 110 may include at least one material selected from, for example, frame retardant 4 (FR-4), tetrafunctional epoxy, polyphenylene ether, epoxy/polyphenylene oxide, bismaleimide triazine (BT), thermount, cyanate ester, polyimide, and liquid crystal polymer.

The plurality of first wiring patterns 120 may include a first upper wiring pattern disposed on an upper surface of at least one first base insulating layer 110 and including a plurality of first upper pads 122, a first lower wiring pattern disposed on a lower surface of the at least one first base insulating layer 110 and including a plurality of first lower pads 124, and a plurality of first conductive vias 128 passing through the at least one first base insulating layer 110 and electrically connecting the first wiring patterns 120 disposed on different wiring layers.

In some embodiments, when the support wiring structure 100 has a plurality of first base insulating layers 110, the first wiring pattern 120 may further include a first internal wiring pattern 126 forming a wiring layer between two adjacent first base insulating layers 110. Each of upper and lower ends of the plurality of first conductive vias 128 may contact any one of a part of the first upper wiring pattern, a part of the first lower wiring pattern, or a part of the first internal wiring pattern 126. The first wiring pattern 120 may include copper, nickel, stainless steel, or beryllium copper.

The wiring layer may be an electrical path extending on a plane. The support wiring structure 100 may have wiring layers on upper and lower surfaces of the at least one first base insulating layer 110. Accordingly, the support wiring structure 100 may include one more layer than the number of the at least one first base insulating layer 110.

The upper surface of the at least one first base insulating layer 110 and the lower surface of the at least one first base layer 110 be upper and lower surfaces of the first base layer 110 when the support wiring structure 100 includes one first base insulating layer 110, and the upper surface of the uppermost first base insulating layer 110 among the first base insulating layers 110 and the lower surface of the lowermost first base insulating layer 110 when the support wiring structure 110 has the plurality of first base insulating layers 110.

The support wiring structure 100 may further include first solder resist layers 130 disposed on the upper and lower surfaces. The first solder resist layer 130 may include a first upper solder resist layer 132 covering the upper surface of the at least one first base insulating layer 110 and exposing the first upper pad 122 of the first upper wiring pattern, and a first lower solder resist layer 134 covering the lower surface of the at least one first base insulating layer 110 and exposing the first lower pad 124 of the first lower wiring pattern.

In some embodiments, the first lower solder resist layer 134 may cover the lower surface of the at least one first base insulating layer 110. In this case, the first upper solder resist layer 132 covering the upper surface of the at least one first base insulating layer 110 may not be provided.

In some embodiments, each of the first upper solder resist layer 132 and the first lower solder resist layer 134 may be formed by applying a solder mask insulating ink on the upper and lower surfaces of the at least one first base insulating layer 110 by using screen printing or inkjet printing and then hardening the at least one first base insulating layer 110 with heat, ultraviolet (UV) or infrared (IR).

In some other embodiments, each of the first upper solder resist layer 132 and the first lower solder resist layer 134 may be formed by applying a photo-imageable solder resist on all of the upper and lower surfaces of the at least one first base insulating layer 110 by using screen printing or spray coating or bonding a film-type solder resist material thereto by using laminating, and then removing unnecessary parts by exposure and development, and hardening the at least one first base insulating layer 110 with heat, UV or IR.

The semiconductor chip 10 may include a semiconductor substrate 12 on which a semiconductor device 14 is formed on an active surface, and a plurality of chip connection pads 16 disposed on the active surface of the semiconductor substrate 12. In some embodiments, when the semiconductor package 1 is a lower package of a package-on-package (PoP), the semiconductor package 1, the semiconductor chip 10, the semiconductor substrate 12, the semiconductor device 14 and the chip connection pad 16 may be referred to as a first semiconductor package, a first semiconductor chip, a first semiconductor substrate, a first semiconductor device, and a first chip connection pad, respectively, or a lower semiconductor package, a lower semiconductor chip, a lower semiconductor substrate, a lower semiconductor device, and a lower chip connection pad respectively.

The semiconductor substrate 12 may include, for example, a semiconductor material such as silicon (Si). Alternatively, the semiconductor substrate 12 may include a semiconductor element such as germanium (Ge), or a compound semiconductor such as silicon carbide (SiC), gallium arsenide (GaAs), indium arsenide (InAs), and indium phosphide (InP). The semiconductor substrate 12 may include a conductive region, for example, a well doped with impurities. The semiconductor substrate 12 may have various device isolation structures such as a shallow trench isolation (STI) structure.

The semiconductor device 14 including a plurality of individual devices of various types may be formed on the active surface of the semiconductor substrate 12. The plurality of individual devices may include various microelectronic devices, for example, a metal-oxide-semiconductor field effect transistor (MOSFET) such as a complementary metal-oxide-semiconductor (CMOS) transistor, an image sensor such as a system large scale integration (LSI), a CMOS imaging sensor (CIS), a micro-electro-mechanical system (MEMS), an active device, a passive device, etc. The plurality of individual devices may be electrically connected to the conductive region of the semiconductor substrate 12. The semiconductor device 14 may further include a conductive wire or a conductive plug electrically connecting at least two of the plurality of individual devices, or the plurality of individual devices and the conductive region of the semiconductor substrate 12. In addition, each of the plurality of individual devices may be electrically separated from other by adjacent individual devices by an insulating layer.

The semiconductor chip 10 may be, for example, a central processing unit (CPU) chip, a graphic processing unit (GPU) chip, or an application processor (AP) chip. In some embodiments, when the semiconductor package 1 may include a plurality of semiconductor chips 10, some of the plurality of semiconductor chips 10 may be, for example, dynamic random access memory (DRAM) chips, static random access memory (SRAM) chips, flash memory chips, electrically erasable and programmable read-only memory (EEPROM) chips, phase-change random access memory (PRAM) chips, magnetic random access memory (MRAM) chips, or resistive random access memory (RRAM) chips.

The semiconductor chip 10 may be mounted on the support wiring structure 100 by using a flip chip. In other words, the semiconductor chip 10 may be mounted on the support wiring structure 100 such that the active surface of the semiconductor substrate 12 faces the support wiring structure 100.

The plurality of chip connection pads 16 of the semiconductor chip 10 electrically connected to the semiconductor device 14 may be electrically connected to the support wiring structure 100. A plurality of chip connection terminals 18 may be disposed between some of the plurality of first upper pads 122 and the plurality of chip connection pads 16 such that the semiconductor chip 10 and the plurality of first wiring patterns 120 of the support wiring structure 100 may be electrically connected. For example, the plurality of chip connection terminals 18 may be solder balls or bumps.

In some embodiments, an underfill layer 50 surrounding the plurality of chip connection terminals 18 may be interposed between the semiconductor chip 10 and the support wiring structure 100. The underfill layer 50 may include, for example, an epoxy resin formed by using a capillary underfill. In some embodiments, the underfill layer 50 may cover at least a part of side surfaces of the semiconductor chip 10. In some other embodiments, the underfill layer 50 may include a projection 50R covering the side surfaces of the semiconductor chip 10, extending onto the upper surface of the semiconductor chip 10, and covering a part of an inactive surface of the semiconductor substrate 12. The projection 50R of the underfill layer 50 may cover a part adjacent to the edge of the upper surface of the semiconductor chip 10. For example, the projection 50R of the underfill layer 50 may contact the upper surface of the semiconductor chip 10 near an edge of the semiconductor chip 10.

The semiconductor chip 10 may include two first side surfaces 10S-N that are opposite to each other and two second side surfaces 10S-W that connect between the two first side surfaces 10S-W and are opposite to each other. In some embodiments, when the semiconductor chip 10 has a rectangular shape in a plane view, the first side surface 10S-N may be a side surface extending in the minor axis direction of the rectangle, and the second side surface 10S-W may be a side surface extending in the major axis direction of the rectangle. For example, the extension length of the first side surface 10S-N may be greater than the second side surface 10S-W.

The expanded layer 160 may include a plurality of connection structures 162 and a filling member 164 surrounding the plurality of connection structures 162 and the semiconductor chip 10. The plurality of connection structures 162 may be spaced apart from the semiconductor chip 10 and may be disposed around the semiconductor chip 10. The plurality of connection structures 162 may pass through the filling member 164 to electrically connect the support wiring structure 100 and the cover wiring structure 200. The upper and lower ends of each of the plurality of connection structures 162 may be connected in contact with any one of a plurality of second lower pads 224 of the cover wiring structure 200 and any one of the plurality of first upper pads 122 of the support wiring structure 100. This way, the first upper pads 122 and the second lower pads 224 may be connected to each other.

Each of the plurality of connection structures 162 may include a through mold via (TMV), a conductive solder, a conductive pillar, or at least one conductive bump. In some embodiments, each of the plurality of connection structures 162 may be formed such that a lower portion to be attached to any one of the plurality of first upper pads 122 of the support wiring structure 100 and an upper portion to be attached to any one of the plurality of second lower pads 224 of the cover wiring structure 200 may reflow by heat and be soldered to form one body.

The filling member 164 may include, for example, an epoxy mold compound (EMC). The filling member 164 may contain a filler 164F. For example, the filling member 164 may include an epoxy-based material containing the filler 164F. In some embodiments, the ratio of the filler 164F included in the filling member 164 may be about 55 wt % to about 85 wt %. The filler 164F may be, for example, a silica filler. The average diameter of the filler 164F may be about 0.1 μm to about several tens of μm. In some embodiments, the average diameter of the filler 164F may be less than a first thickness T1 of a solder resist patch 240.

The cover wiring structure 200 may be, for example, a PCB, a ceramic substrate, a package manufacturing wafer, or an interposer. In some embodiments, the cover wiring structure 200 may be a multi-layer PCB. When the cover wiring structure 200 is the PCB, the cover wiring structure 200 may also be referred to as a cover PCB, an upper PCB, or a second PCB.

The cover wiring structure 200 may include the at least one second base insulating layer 210 and a plurality of second wiring patterns 220. The second base insulating layer 210 may include at least one material selected from phenol resin, epoxy resin, and polyimide.

The plurality of second wiring patterns 220 may include a second upper wiring pattern disposed on the upper surface of the at least one second base insulating layer 210 and including a plurality of second upper pads 222, a second lower wiring pattern disposed on the lower surface of the at least one second base insulating layer 210 and including a plurality of second lower pads 224, and a plurality of second conductive vias 228 passing through the at least one second base insulating layer 210 and electrically connecting the second wiring patterns 220 disposed on different wiring layers. For example, a second upper pad 222 may be connected to a second lower pad 224 through a second conductive via 228.

In some embodiments, when the cover wiring structure 200 includes the plurality of second base insulating layers 210, the second wiring pattern 220 may further include a second internal wiring pattern forming a wiring layer between two adjacent second base insulating layers 210 and similar to the first internal wiring pattern 126. Each of upper and lower ends of the plurality of second conductive vias 228 may contact any one of a part of the second upper wiring pattern, a part of the second lower wiring pattern, or a part of the second internal wiring pattern. The second wiring pattern 220 may include copper, nickel, stainless steel, or beryllium copper.

In FIG. 1B, the support wiring structure 100 includes four wiring layers and the cover wiring structure 200 includes two wiring layers, but this is merely exemplary and the inventive concept is not limited thereto. In some embodiments, the number of wiring layers included in the support wiring structure 100 may be greater than the number of wiring layers included in the cover wiring structure 200.

The cover wiring structure 200 may further include second solder resist layers 230 disposed on the upper and lower surfaces. The second solder resist layers 230 may include a second upper solder resist layer 232 covering the upper surface of the at least one second base insulating layer 210 and exposing the second upper pad 222 of the second upper wiring pattern, and a second lower solder resist layer 234 covering the lower surface of the at least one second base insulating layer 210 and exposing the second lower pad 224 of the second lower wiring pattern.

In some embodiments, each of the second upper solder resist layer 232 and the second lower solder resist layer 234 may be formed by applying a solder mask insulating ink on the upper and lower surfaces of the at least one second base insulating layer 210 by using screen printing or inkjet printing and then hardening the at least one second base insulating layer 210 with heat, UV or IR.

In some other embodiments, each of the second upper solder resist layer 232 and the second lower solder resist layer 234 may be formed by applying a photo-imageable solder resist on all of the upper and lower surfaces of the at least one second base insulating layer 210 by using screen printing or spray coating or bonding a film-type solder resist material thereto by using laminating, and then removing unnecessary parts by exposure and development, and hardening the at least one second base insulating layer 210 with heat, UV or IR.

In FIGS. 1A and 1B, for convenience of illustration, only the first upper pad 122 of the first upper wiring patterns is illustrated, only the first lower pad 124 of the first lower wiring patterns is illustrated, only the second upper pad 222 of the second upper wiring pattern is illustrated, and only the second lower pad 224 of the second lower wiring patterns is illustrated. However, it is to be understood that the support wiring structure 100 may include a part of the first upper wiring pattern extending between the at least one first base insulating layer 110 and the first upper solder resist layer 132 and/or a part of the first lower wiring pattern extending between the at least one first base insulating layer 110 and the first lower solder resist layer 134. In addition, it is to be understood that the support wiring structure 200 may include a part of the second upper wiring pattern extending between the at least one second base insulating layer 210 and the second upper solder resist layer 232 and/or a part of the second lower wiring pattern extending between the at least one second base insulating layer 210 and the second lower solder resist layer 234.

The cover wiring structure 200 may include a cavity 200CV penetrating from the upper surface to the lower surface near the center in a plane view. In some embodiments, the cavity 200CV may have a rectangular shape in a plane view. The planar area inside the cavity 200CV may be less than the planar area of the semiconductor chip 10. The cavity 200CV of the cover wiring structure 200 does not overlap a part adjacent to the edge of the semiconductor chip 10 in a plane view, in other words, a part adjacent to the first side surface 10S-N and the second side surface 10S-W in a vertical direction, but may overlap the remaining inner part of the semiconductor chip 10 in the vertical direction in a plane view. In other, the cover wiring structure 200 including the cavity 200CV may overlap the part adjacent to the edge of the semiconductor chip 10, in other words, the part adjacent to the first side surface 10S-N and the second side surface 10S-W. For example, the central portion of the semiconductor chip 10 may be exposed by the cavity 200CV of the cover wiring structure 200, and the edge portions of the semiconductor chip 10 surrounding the central portion of the semiconductor chip 10 may be overlapped by the cover wiring structure 200. The cavity 200CV may expose the filling member 164.

The cover wiring structure 200 may further include a plurality of solder resist patches 240 disposed on the lower surface thereof. In some embodiments, the plurality of solder resist patches 240 may have a circular horizontal cross section. The plurality of solder resist patches 240 may be disposed adjacent to the cavity 200CV. In some embodiments, the plurality of solder resist patches 240 may be disposed adjacent to the cavity 200CV, spaced apart from each other, and arranged in a row.

A first width W1 which is the maximum horizontal width of each of the plurality of solder resist patches 240 may be, for example, about 100 μm to about 300 μm. For example, when the plurality of solder resist patches 240 have a circular horizontal cross section, the first width W1 may be a diameter of the circular horizontal cross section. The plurality of solder resist patches 240 may have a first interval IT1 by which they are spaced apart from each other, have a first pitch PT1, and be arranged in a row. In some embodiments, the first interval IT1 may be greater than or equal to twice the average diameter of the filler 164F. The first interval IT1 may be, for example, about 100 μm or more. The first pitch PT1 may be the sum of the first width W1 and the first interval IT1.

The plurality of solder resist patches 240 may be spaced apart from the edge of the semiconductor chip 10 by a second width W2 and may be disposed in contact with the inactive surface, in other words, the upper surface of the semiconductor chip 10. In some embodiments, the plurality of solder resist patches 240 may be spaced apart by a third width W3 from the edge of the cavity 200CV. In some other embodiments, the third width W3 may be 0. In other words, the plurality of solder resist patches 240 may be disposed in contact with the edge of the cavity 200CV. The second width W2 may be greater than the first width W1. The second width W2 may be greater than the third width W3. The third width W3 may be less than the first width W1. For example, the second width W2 may be about 300 μm or more.

The edge of the cavity 200CV of the cover wiring structure 200 may be spaced apart from each of the first side surface 10S-N and the second side surface 10S-W of the semiconductor chip 10 by a fourth width W4 and a fifth width W5 respectively. In other words, a part of the semiconductor chip 10 adjacent to the first side surface 10S-N of the semiconductor chip 10 may overlap the cover wiring structure 200 by the fourth width W4 in the vertical direction, and a part of the semiconductor chip 10 adjacent to the second side surface 10S-W of the semiconductor chip 10 may overlap the cover wiring structure 200 by the fifth width W5 in the vertical direction. The fourth width W4 may be the sum of the first width W1, the second width W2, and the third width W3. In some embodiments, the fourth width W4 may be equal to the fifth width W5 or may be greater than the fifth width W5.

The plurality of solder resist patches 240 may be disposed between the second lower solder resist layer 234 and the semiconductor chip 10 to maintain an interval between the cover wiring structure 200 and the semiconductor chip 10. In some embodiments, the plurality of solder resist patches 240 may be spaced apart from each other along each of the two second side surfaces 10S-N of the semiconductor chip 10 and may be disposed in a row.

In some embodiments, the plurality of solder resist patches 240 may be formed by applying a solder mask insulating ink on the second lower solder resist layer 234 by using screen printing or inkjet printing and then hardening the second lower solder resist layer 234 with heat, UV or IR.

In some other embodiments, the plurality of solder resist patches 240 may be formed by applying a photo-imageable solder resist on all of the upper and lower surfaces of the second lower solder resist layer 234 by using screen printing or spray coating or bonding a film-type solder resist material thereto by using laminating, and then removing unnecessary parts by exposure and development, and hardening the second lower solder resist layer 234 with heat, UV or IR.

The first thickness T1 which is the thickness of each of the plurality of solder resist patches 240 may be greater than the second thickness T2 which is the thickness of each of the second upper solder resist layer 232 and the second lower solder resist layer 234. The first thickness T1 may be greater than the second thickness T2, for example, 1.5 times, but is not limited thereto. For example, the first thickness T1 may be about 30 μm, and the second thickness T2 may be about 10 μm to about 20 μm.

An interval between the second lower solder resist layer 234 of the cover wiring structure 200 and the semiconductor chip 10 overlapping each other in the vertical direction may have the same value as that of the first thickness T1. For example, the interval between the second lower solder resist layer 234 of the cover wiring structure 200 and the semiconductor chip 10 overlapping each other in the vertical direction may be about 30 μm.

The filling member 164 may fill between the support wiring structure 100 and the cover wiring structure 200, and may surround the plurality of connection structures 162 and the semiconductor chip 10. The filling member 164 may cover the side surface and the inactive surface of the semiconductor chip 10, in other words, the side surface and the upper surface of the semiconductor chip 10. The filling member 164 may surround the side surfaces of the plurality of solder resist patches 240. The filling member 164 may have a filling protrusion 164P on a part of the upper surface of the semiconductor chip 10 that protrudes away from the upper surface of the semiconductor chip 10. The filling protrusion 164P may fill the cavity 200CV of the cover wiring structure 200.

The uppermost end of the filling member 164, in other words, the upper surface of the filling protrusion 164P and the uppermost end of the cover wiring structure 200, in other words, the upper surface of the second upper solder resist layer 232, may be located at the same vertical level and may be coplanar.

The cover wiring structure 200 may have the third thickness T3, and the support wiring structure 100 may have the fourth thickness T4. In some embodiments, the fourth thickness T4 may be greater than the third thickness T3. The filling protrusion 164P may have a fifth thickness T5 on the semiconductor chip 10. The fifth thickness T5 may be greater than the third thickness T3. For example, the fifth thickness T5 may be the sum of the first thickness T1 and the third thickness T3. In some embodiments, the third thickness T3 may be about 90 μm to about 100 μm, the fourth thickness T4 may be about 120 μm, and the fifth thickness T5 may be about 120 μm to about 130 μm.

The filling member 164 may be formed by being injected between the support wiring structure 100 and the cover wiring structure 200 while an upper mold (MDU of FIG. 6C) covers the upper surface of the cover wiring structure 200. Accordingly, the filling member 164 may fill the space between the support wiring structure 100 and the cover wiring structure 200 and the cavity 200CV.

The filling member 164 may be injected between the support wiring structure 100 and the cover wiring structure 200 along an injection direction DF. In some embodiments, the injection direction DF may be the minor axis direction of the semiconductor chip 10. For example, the plurality of solder resist patches 240 may be spaced apart along each of the two second side surfaces 10S-N of the semiconductor chip 10 along the minor axis direction of the semiconductor chip 10, in other words, along the injection direction DF and may be arranged in a row.

The semiconductor package 1 may include a plurality of external connection terminals 150 attached to the plurality of first lower pads 124. For example, the height of each of the plurality of external connection terminals 150 may be about 150 μm. For example, the plurality of external connection terminals 150 may be solder balls.

In the semiconductor package 1 according to an exemplary embodiment of the inventive concept, the plurality of solder resist patches 240 may be disposed between the second lower solder resist layer 234 and the semiconductor chip 10 and maintain the interval between the cover wiring structure 200 including the cavity 200CV and the semiconductor chip 10. Accordingly, the filling member 164 may be smoothly injected along the interval between the cover wiring structure 200 and the semiconductor chip 10. In addition, because the plurality of solder resist patches 240 may be spaced apart from each other along the injection direction DF and arranged in a row, the filling member 164 may not be prevented from being injected between the cover wiring structure 200 and the semiconductor chip 10.

Accordingly, a void in which the filling member 164 is not filled may be prevented from occurring in the semiconductor package 1 according to the present embodiment, and thus the reliability of the semiconductor package 1 may be increased.

In addition, because the cover wiring structure 200 includes the cavity 200CV, the semiconductor package 1 according to the present embodiment may reduce a warpage shape of the semiconductor package 1 that may occur due to a difference of a coefficient of thermal expansion between the support wiring structure 100 and the cover wiring structure 200. Therefore, to form the package-on package, reliability of an electrical connection with an upper package attached to the semiconductor package 1 and/or reliability of an electrical connection with an external system to which the semiconductor package 1 is attached through the plurality of external connection terminals 150 may be increased.

FIGS. 2A to 2E are top views of semiconductor packages 1a to 1e according to exemplary embodiments of the inventive concept. In FIGS. 2A to 2E, the same reference numerals as in FIGS. 1A and 1B may denote the same components, and thus, redundant descriptions may be omitted.

Figure 2A:
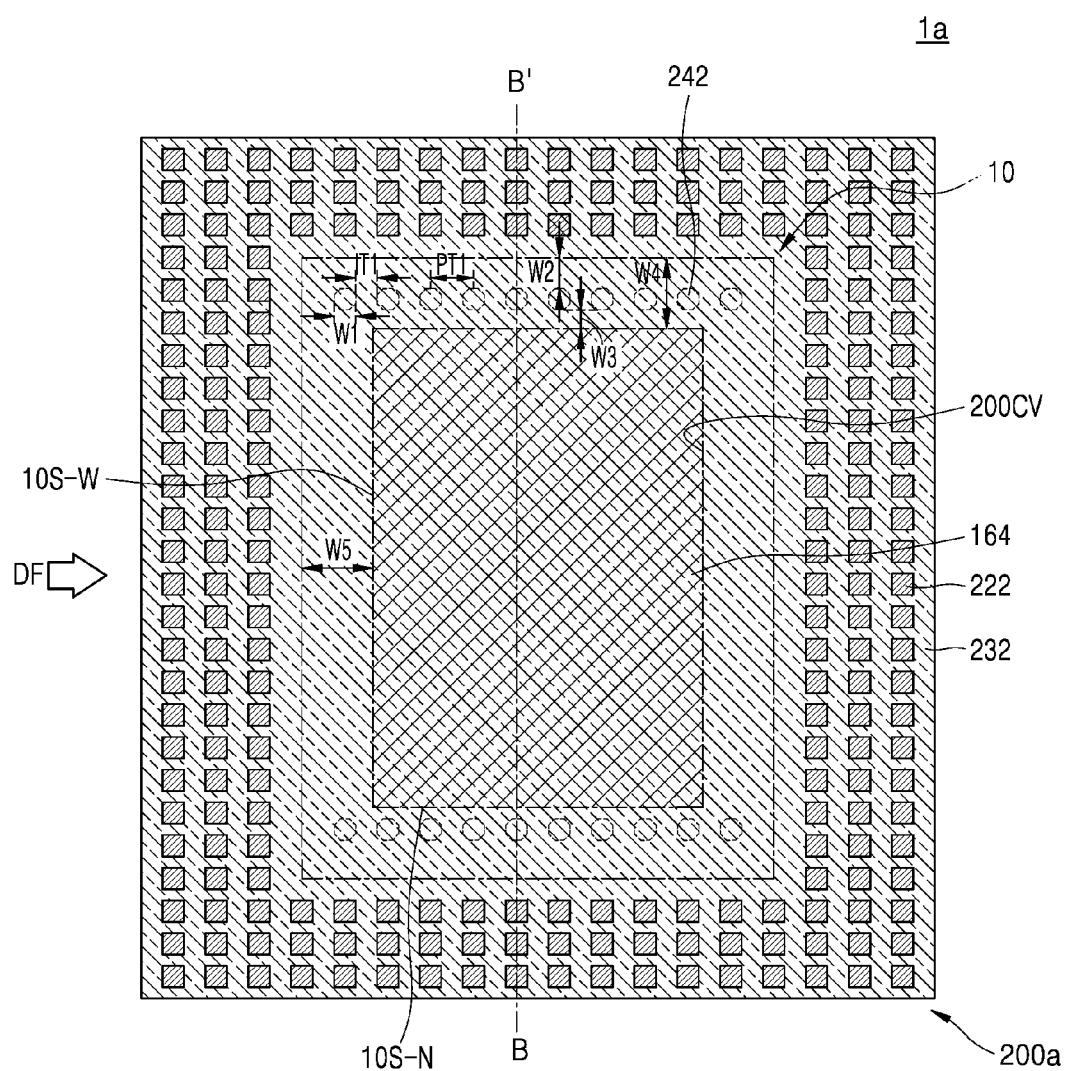
FIGS. 2A, 2B, 2C, 2D and 2E are top views of semiconductor packages according to exemplary embodiments of the inventive concept.

Referring to FIG. 2A, the semiconductor package 1a may include a cover wiring structure 200a disposed on the semiconductor chip 10. The cover wiring structure 200a may include the cavity 200CV penetrating from the upper surface to the lower surface near the center in a plane view. The cover wiring structure 200a may include a plurality of solder resist patches 242 disposed on the lower surface thereof. The plurality of solder resist patches 242 may have a polygonal horizontal cross section. In some embodiments, the plurality of solder resist patches 242 may have a polygon having a horizontal cross section close to a circular shape. For example, the plurality of solder resist patches 242 may have an octagonal, hexagonal, or pentagonal horizontal cross section, but are not limited thereto.

A cross-sectional view of the semiconductor package 1a taken along line B-B' of FIG. 2A may be substantially the same as the cross-sectional view of the semiconductor package 1 shown in FIG. 1B except that a plurality of solder resist patches 242 are disposed instead of the plurality of solder resist patches 240.

Figure 2B:
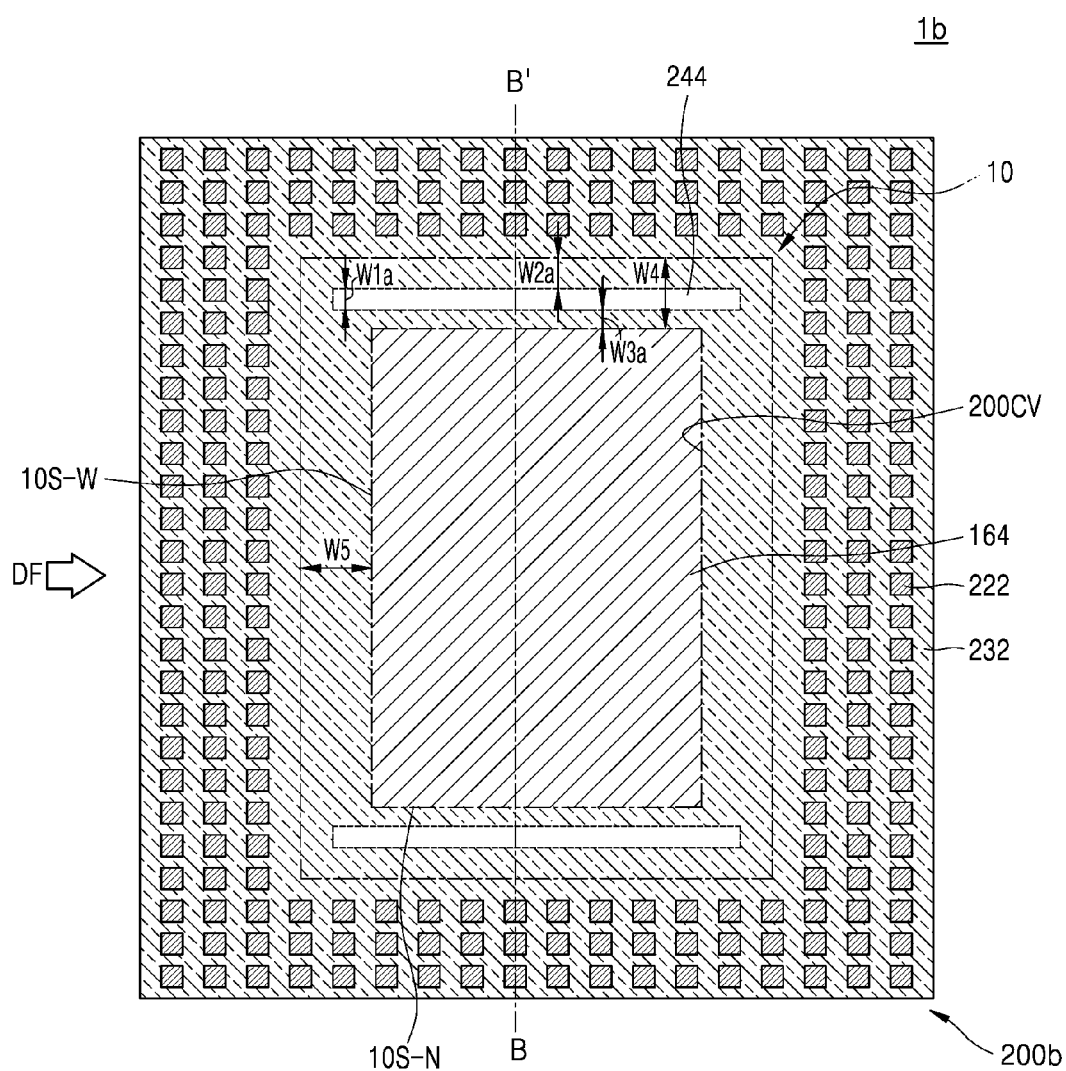

Referring to FIG. 2B, the semiconductor package 1b may include a cover wiring structure 200b disposed on the semiconductor chip 10. The cover wiring structure 200b may include the cavity 200CV penetrating from the upper surface to the lower surface near the center in a plane view.

The cover wiring structure 200b may include at least two solder resist patches 244 disposed on the lower surface thereof. The at least two solder resist patches 244 may have a bar shape in a horizontal cross section. For example, the at least two solder resist patches 244 may have a bar shape in which the semiconductor chip 10 extends along the two opposite first side surfaces 10S-N.

A first width W1a which is the maximum horizontal width of each of the at least two solder resist patches 244 may be, for example, about 100 μm to about 300 μm. The at least two solder resist patches 244 may be spaced apart from the edge of the semiconductor chip 10 by a second width W2a and may be disposed in contact with an inactive surface of the semiconductor chip 10, in other words, the upper surface of the semiconductor chip 10. The at least two solder resist patches 244 may be spaced apart by a third width W3a from the edge of the cavity 200CV. The second width W2a may be greater than the first width W1a. The second width W2a may be greater than the third width W3a. The third width W3a may be less than the first width W1a. For example, the second width W2a may be about 300 μm or more.

A cross-sectional view of the semiconductor package 1b taken along line B-B' of FIG. 2B may be substantially the same as the cross-sectional view of the semiconductor package 1 shown in FIG. 1B except that the at least two solder resist patches 244 are disposed instead of the plurality of solder resist patches 240.

Figure 2C:
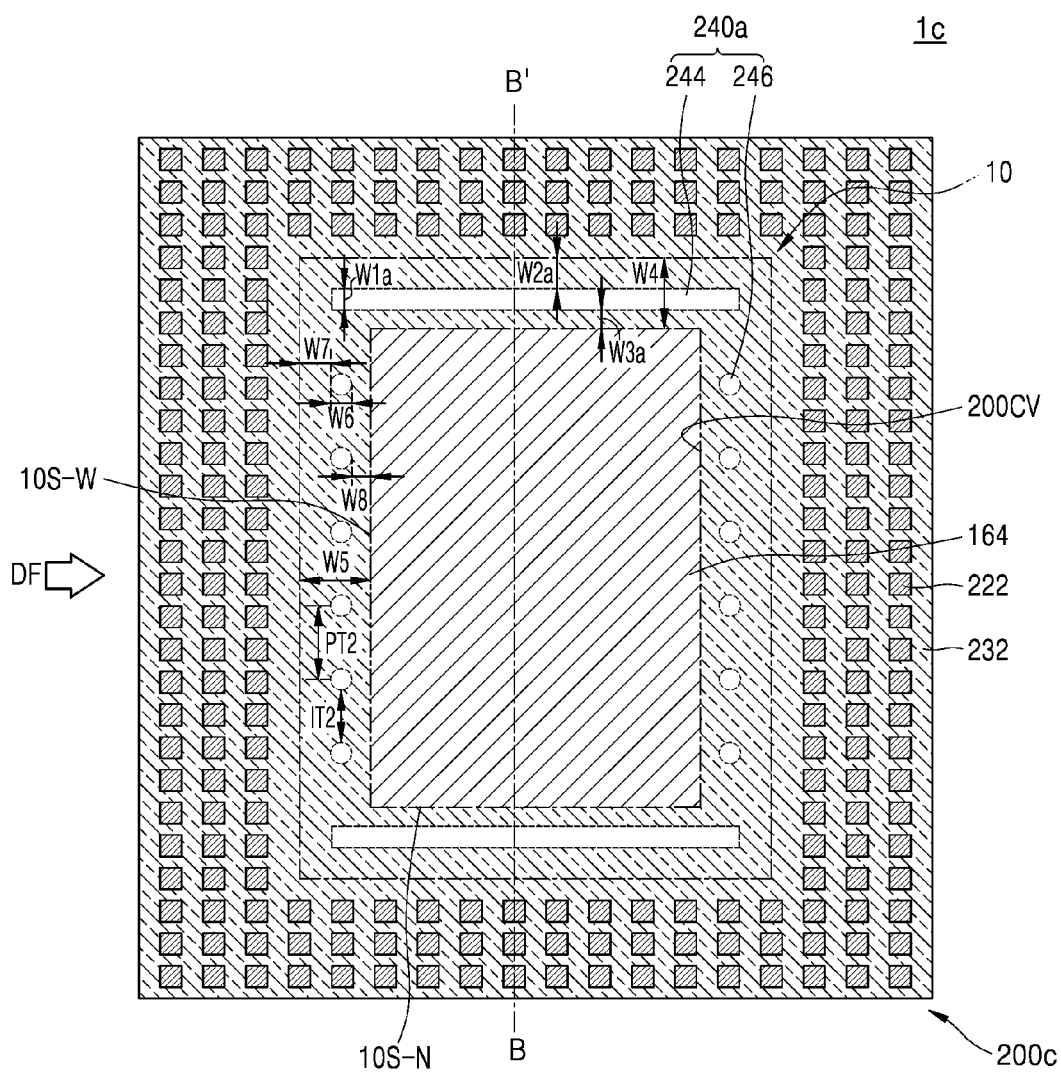

Referring to FIG. 2C, the semiconductor package 1c may include a cover wiring structure 200c disposed on the semiconductor chip 10. The cover wiring structure 200c may include the cavity 200CV penetrating from the upper surface to the lower surface near the center in a plane view. The cover wiring structure 200a may include a plurality of solder resist patches 240a disposed on the lower surface thereof.

The plurality of solder resist patches 240a may include the at least two first solder resist patches 244 and a plurality of second solder resist patches 246. The at least two first solder resist patches 244 may be substantially the same as the at least two solder resist patches 244 shown in FIG. 2B.

In some embodiments, the plurality of second solder resist patches 246 may have a circular cross section. In some other embodiments, the plurality of second solder resist patches 246 may have a polygonal horizontal cross section similar to the plurality of solder resist patches 242 shown in FIG. 2A. In some embodiments, the plurality of second solder resist patches 246 may be a polygon having a horizontal cross section close to a circular shape. For example, the plurality of second solder resist patches 246 may have an octagonal, hexagonal, or pentagonal horizontal cross section, but are not limited thereto.

The plurality of second solder resist patches 246 may be disposed adjacent to the cavity 200CV. In some embodiments, the plurality of solder resist patches 246 may be disposed adjacent to the cavity 200CV, spaced apart from each other, and arranged in a row. In some embodiments, the plurality of second solder resist patches 246 may be spaced apart from each other along each of the two first side surfaces 10S-W of the semiconductor chip 10 and may be arranged in a row.

A sixth width W6 which is the maximum horizontal width of each of the plurality of second solder resist patches 246 may be, for example, about 100 µm to about 300 µm. The plurality of second solder resist patches 246 may have a second interval IT2 and may be spaced apart from each other, have a second pitch PT2, and may be arranged in a row. In some embodiments, the second interval 112 may be greater than three times or more the average diameter of the filler 164F shown in FIG. 1B. The second interval IT2 may be, for example, about 150 µm or more. The second pitch PT2 may be the sum of the sixth width W6 and the second interval IT2.

The plurality of second solder resist patches 246 may be spaced apart from the edge of the semiconductor chip 10 by a seventh width W7 and disposed in contact with the inactive surface of the semiconductor chip 10, in other words, the upper surface of the semiconductor chip 10. The plurality of second solder resist patches 246 may be spaced apart from the edge of the cavity 200CV by a width W8. The seventh width W7 may be greater than the sixth width W6. The seventh width W7 may be greater than the eighth width W8. The eighth width W8 may be less than the sixth width W6. For example, the seventh width W7 may be about 300 µm or more.

The fourth width W4 may be the sum of the first width W1a, the second width W2a, and the third width W3a. The fifth width W5 may be the sum of the sixth width W6, the seventh width W7, and the eighth width W8. In some embodiments, the fourth width W4 may have a value equal to or greater than that of the fifth width W5.

In some embodiments, the sixth width W6 may have the same value as that of the first width W1a. In some embodiments, the seventh width W7 may have a value equal to or less than that of the second width W2a. In some embodiments, the eighth width W8 may have a value equal to or greater than that of the third width W3a.

A cross-sectional view of the semiconductor package 1c taken along line B-B' of FIG. 2C may be substantially the same as the cross-sectional view of the semiconductor package 1 shown in FIG. 1B except that the at least two first solder resist patches 244 are disposed instead of the plurality of solder resist patches 240.

Figure 2D:
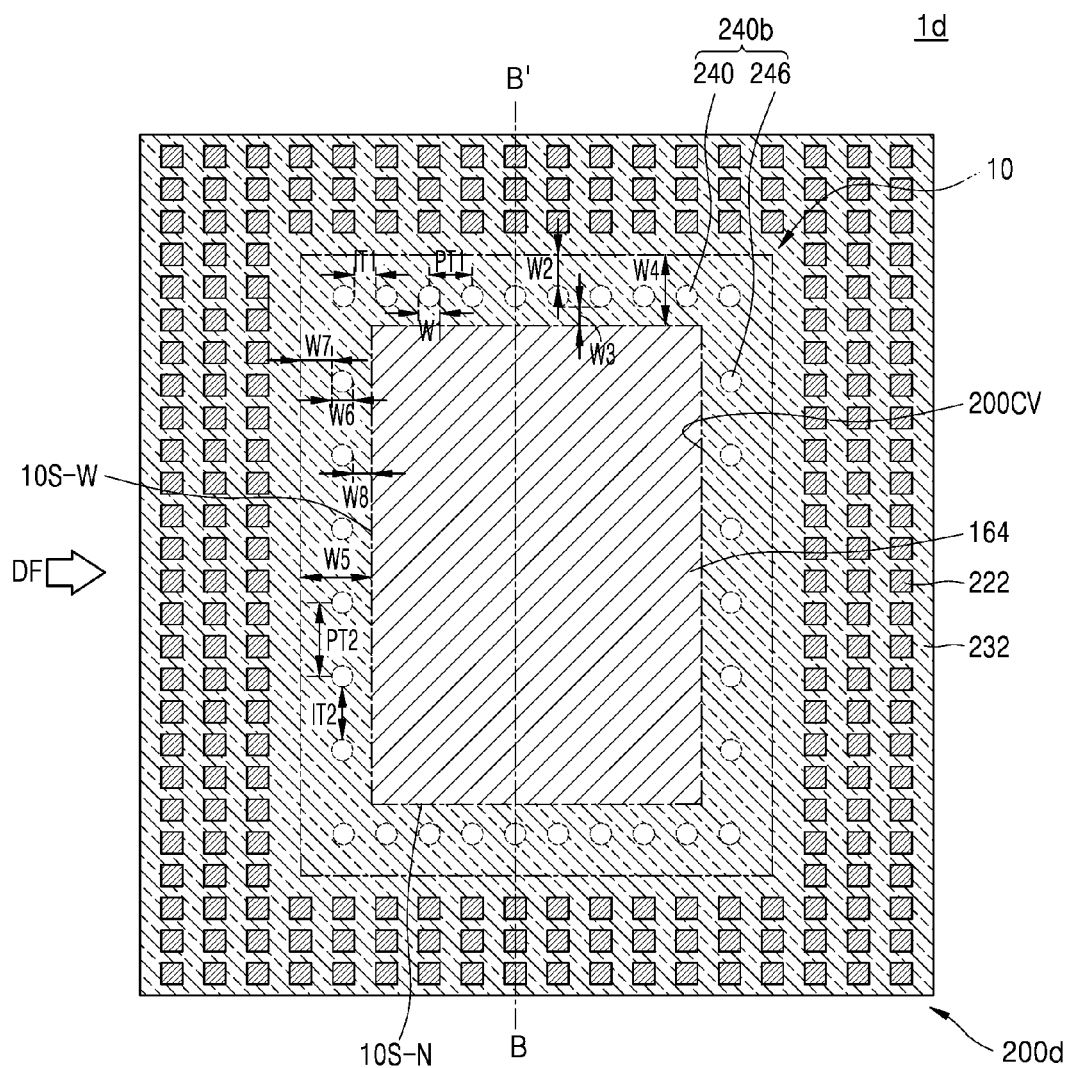

Referring to FIG. 2D, the semiconductor package 1d may include a cover wiring structure 200d disposed on the semiconductor chip 10. The cover wiring structure 200d may include the cavity 200CV penetrating from the upper surface to the lower surface near the center in a plane view. The cover wiring structure 200d may include a plurality of solder resist patches 240b disposed on the lower surface thereof.

The plurality of solder resist patches 240b may include the plurality of first solder resist patches 240 and the plurality of second solder resist patches 246. The plurality of first solder resist patches 240 may be substantially the same as the plurality of solder resist patches 240 shown in FIGS. 1A and 1B. The plurality of second solder resist patches 246 may be substantially the same as the plurality of second solder resist patches 246 shown in FIG. 2C.

The first width W1 which is the maximum horizontal width of each of the plurality of first solder resist patches 240 may be, for example, about 100 µm to about 300 µm. The sixth width W6 which is the maximum horizontal width of each of the plurality of second solder resist patches 246 may be, for example, about 100 µm to about 300 µm. In some embodiments, the sixth width W6 may have the same value as that of the first width W1.

The plurality of first solder resist patches 240 may have the first interval IT1 and may be spaced apart from each other, have the first pitch PT1, and may be arranged in a row. The first pitch PT1 may be the sum of the first width W1 and the first interval IT1. In some embodiments, the first interval IT1 may be greater than or equal to twice the average diameter of the filler 164F shown in FIG. 1B. The first interval IT1 may be, for example, about 100 µm or more. The plurality of second solder resist patches 246 may have the second interval IT2 and may be spaced apart from each other, have the second pitch PT2, and may be arranged in a row. The second pitch PT2 may be the sum of the second width W2 and the second interval IT2. In some embodiments, the second interval IT2 may be greater than three times or more the average diameter of the filler 164F. The second interval IT2 may be, for example, about 150 µm or more. For example, the second interval IT2 and the second pitch PT2 may have values greater than those of the first interval IT1 and the first pitch PT1 respectively.

In some embodiments, the seventh width W7 may have a value equal to or less than that of the second width W2. In some embodiments, the eighth width W8 may have a value equal to or greater than that of the third width W3.

A cross-sectional view of the semiconductor package 1d taken along line B-B' of FIG. 2D may be substantially the same as the cross-sectional view of the semiconductor package 1 shown in FIG. 1B.

Figure 2E:
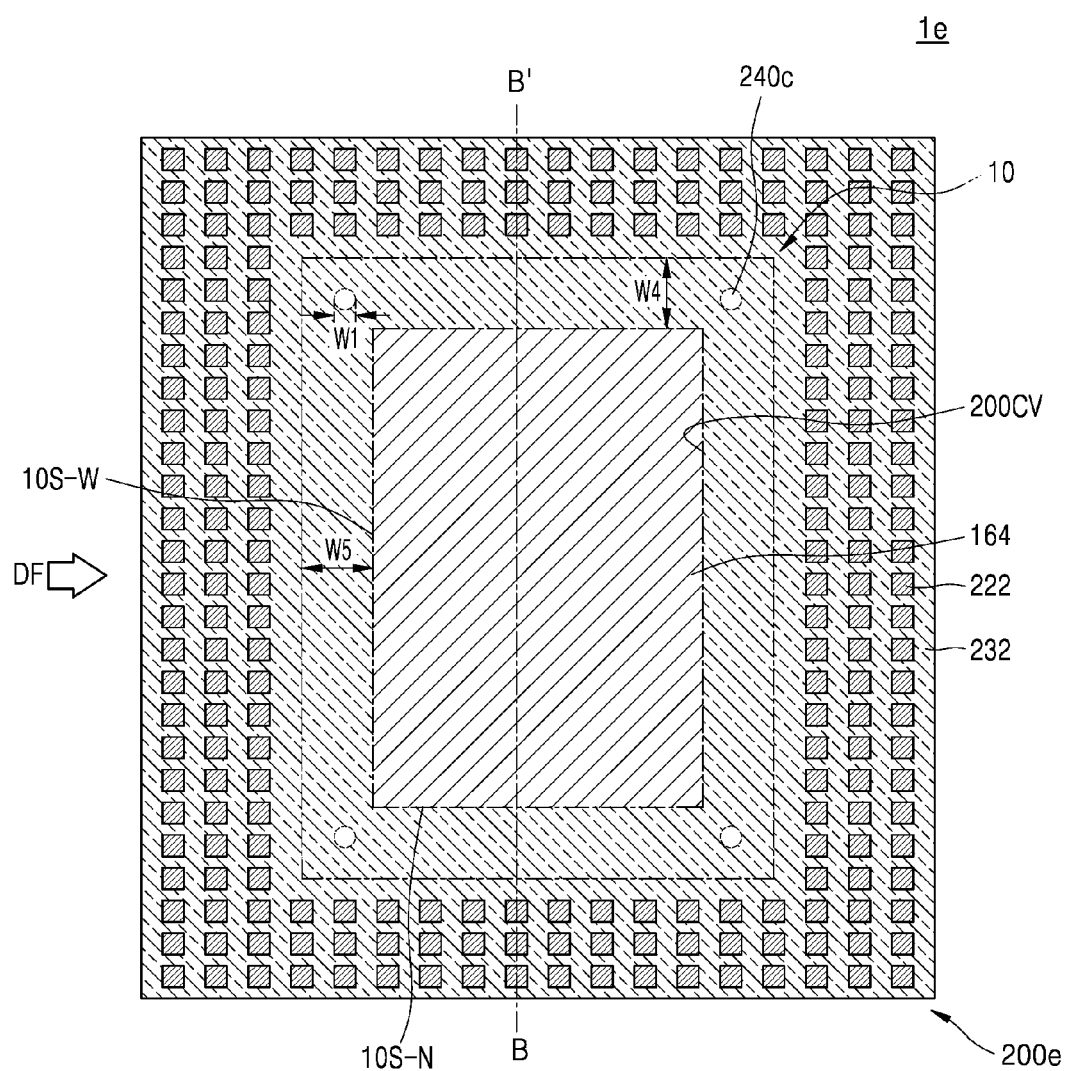

Referring to FIG. 2E, the semiconductor package 1e may include a cover wiring structure 200e disposed on the semiconductor chip 10. The cover wiring structure 200e may include the cavity 200CV penetrating from the upper surface to the lower surface near the center in a plane view. The cover wiring structure 200e may include a plurality of solder resist patches 240c disposed on the lower surface thereof. The plurality of solder resist patches 240c may have a circular horizontal cross section. In some other embodiments, the plurality of solder resist patches 240c may have a polygonal horizontal cross section similar to the plurality of solder resist patches 242 shown in FIG. 2A. In some embodiments, the plurality of solder resist patches 240c may have a polygon having a horizontal cross section close to a circular shape.

The plurality of solder resist patches 240c may be disposed adjacent to corners of the cavity 200CV and corners of the semiconductor chip 10 in a plane view. For example, the plurality of solder resist patches 240c may be disposed between the corners of the cavity 200CV and the corners of the semiconductor chip 10 corresponding to each other in a plane view. In some embodiments, the semiconductor package 1e may include the four solder resist patches 240c that are respectively disposed between the corners of the cavity 200CV and the corners of the semiconductor chip 10 corresponding to each other in a plane view. However, the inventive concept is not limited thereto and more than one solder resist patch 240c may be located at a corner of the cavity 200CV or a corner of the semiconductor chip 10.

A cross-sectional view of the semiconductor package 1e taken along line B-B' of FIG. 2E may be substantially the same as the cross-sectional view of the semiconductor package 1 shown in FIG. 1B except that the plurality of solder resist patches 240c are not shown in the cross-sectional view.

Figure 3A:
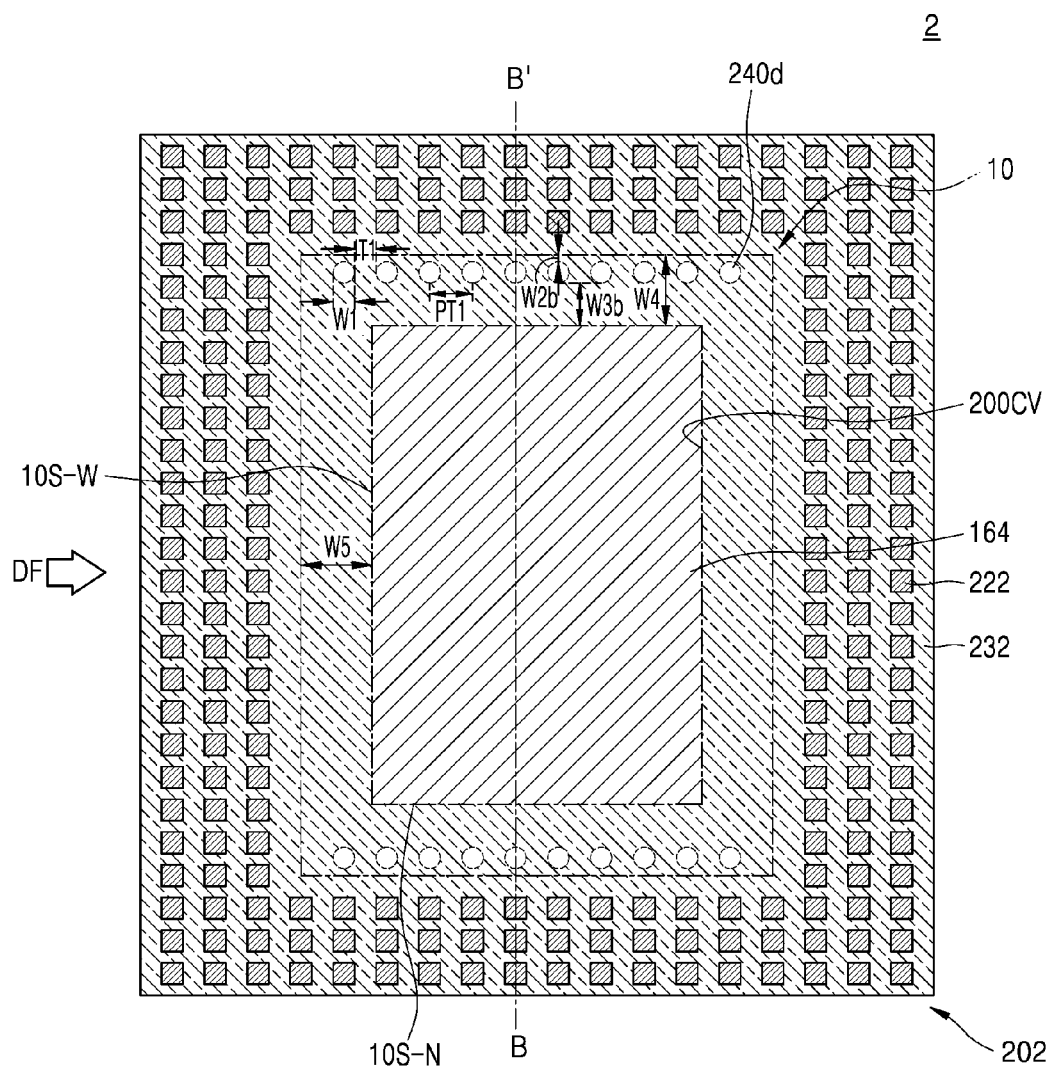
FIG. 3A is a top view of a semiconductor package according to exemplary embodiments of the inventive concept.
Figure 3B:
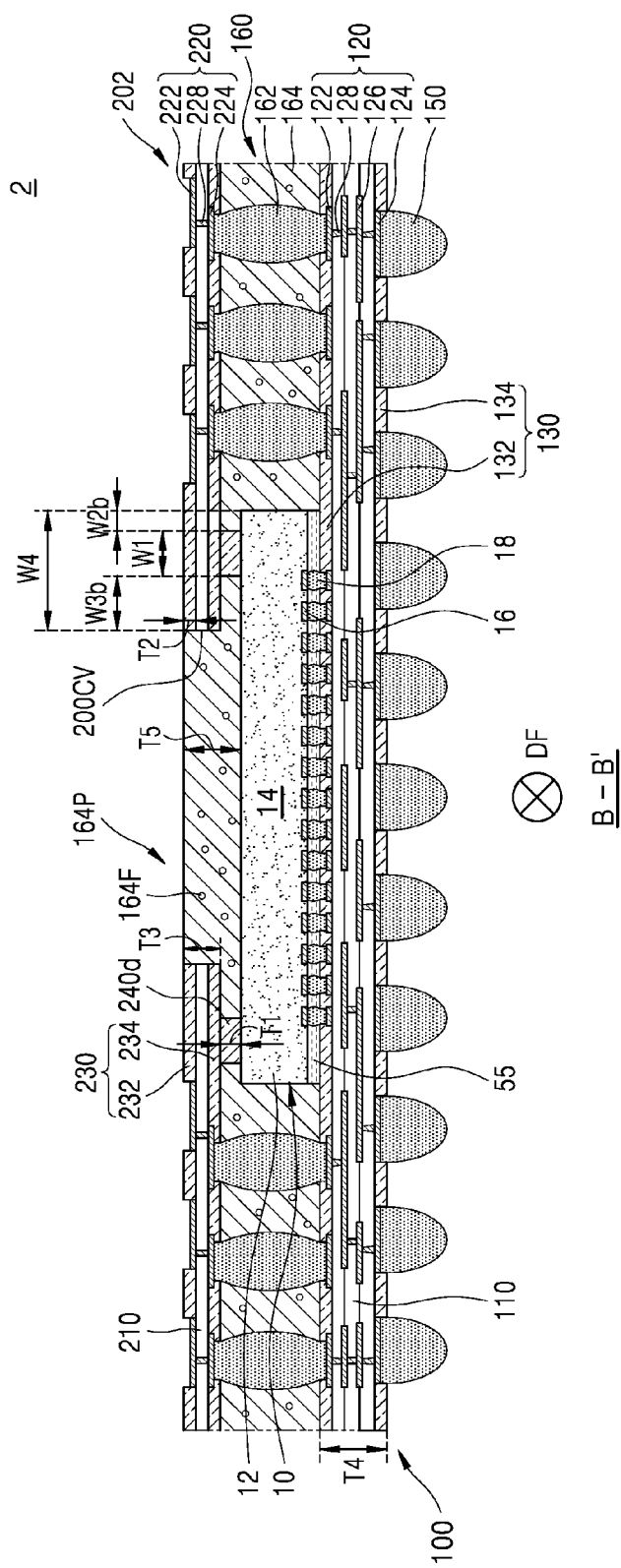
FIG. 3B is a cross-sectional view of the semiconductor package according to exemplary embodiments of the inventive concept.

FIG. 3A is a top view of a semiconductor package 2 according to exemplary embodiments of the inventive concept, and FIG. 3B is a cross-sectional view of the semiconductor package 2 according to exemplary embodiments of the inventive concept. FIG. 3B is a cross-sectional view taken along line B-B' of FIG. 3A. In FIGS. 3A and 3B, the same reference numerals as those of FIGS. 1A and 1B may denote the same components, and thus, redundant descriptions may be omitted.

Referring to FIGS. 3A and 3B, the semiconductor package 2 may include the support wiring structure 100, the expanded layer 160 disposed on the support wiring structure 100, the semiconductor chip 10 disposed in the expanded layer 160, and a cover wiring structure 202 disposed on the expanded layer 160.

The cover wiring structure 202 may include the cavity 200CV penetrating from the upper surface to the lower surface near the center in a plane view. The cover wiring structure 202 may include a plurality of solder resist patches 240*d* disposed on the lower surface thereof. In some embodiments, the plurality of solder resist patches 240*d* may have a circular horizontal cross section. In some other embodiments, the plurality of second solder resist patches 240*d* may have a polygonal horizontal cross section similar to the plurality of solder resist patches 242 shown in FIG. 2A. In some embodiments, the plurality of second solder resist patches 240*d* may be a polygon having a horizontal cross section close to a circular shape. For example, the plurality of second solder resist patches 240*d* may have an octagonal, hexagonal, or pentagonal horizontal cross section, but are not limited thereto.

In some embodiments, an underfill layer 55 surrounding the plurality of chip connection terminals 18 may be interposed between the semiconductor chip 10 and the support wiring structure 100. In some embodiments, the underfill layer 55 may be a non-conductive film (NCF). In some embodiments, the underfill layer 55 may cover at least a part of the side surface of the semiconductor chip 10. Unlike the underfill layer 50 shown in FIG. 1B, the underfill layer 55 shown in FIG. 3B may not extend onto the upper surface of the semiconductor chip 10. For example, the underfill layer 55 may only be disposed between the bottom of the semiconductor chip 10 and the support wiring structure 100.

The first width W1 which is the maximum horizontal width of each of the plurality of solder resist patches 240*d* may be, for example, about 100 µm to about 300 µm. The plurality of solder resist patches 240*d* may have the first interval IT1, be spaced apart from each other, have the first pitch PT1, and be arranged in a row.

The plurality of solder resist patches 240*d* may be spaced apart from the edge of the semiconductor chip 10 by a second width W2*b* and may be disposed in contact with the inactive surface, in other words, the upper surface of the semiconductor chip 10. In some embodiments, the plurality of solder resist patches 240*d* may be spaced apart by a third width W3*b* from the edge of the cavity 200CV. In some embodiments, the second width W2*b* may be less than the first width W1. The second width W2*b* may be less than the third width W3*b*. For example, the second width W2*b* may be less than 300 µm.

In some embodiments, the semiconductor package 2 may include the plurality of solder resist patches 240 shown in FIGS. 1A and 1B, the plurality of solder resist patches 242 shown in FIG. 2A, the plurality of solder resist patches 244 shown in FIG. 2B, the plurality of solder resist patches 240*a* shown in FIG. 2C, the plurality of solder resist patches 240*b* shown in FIG. 2D, or the plurality of solder resist patches 240*c* shown in FIG. 2E, instead of the plurality of solder resist patches 240*d*.

Figure 4A:
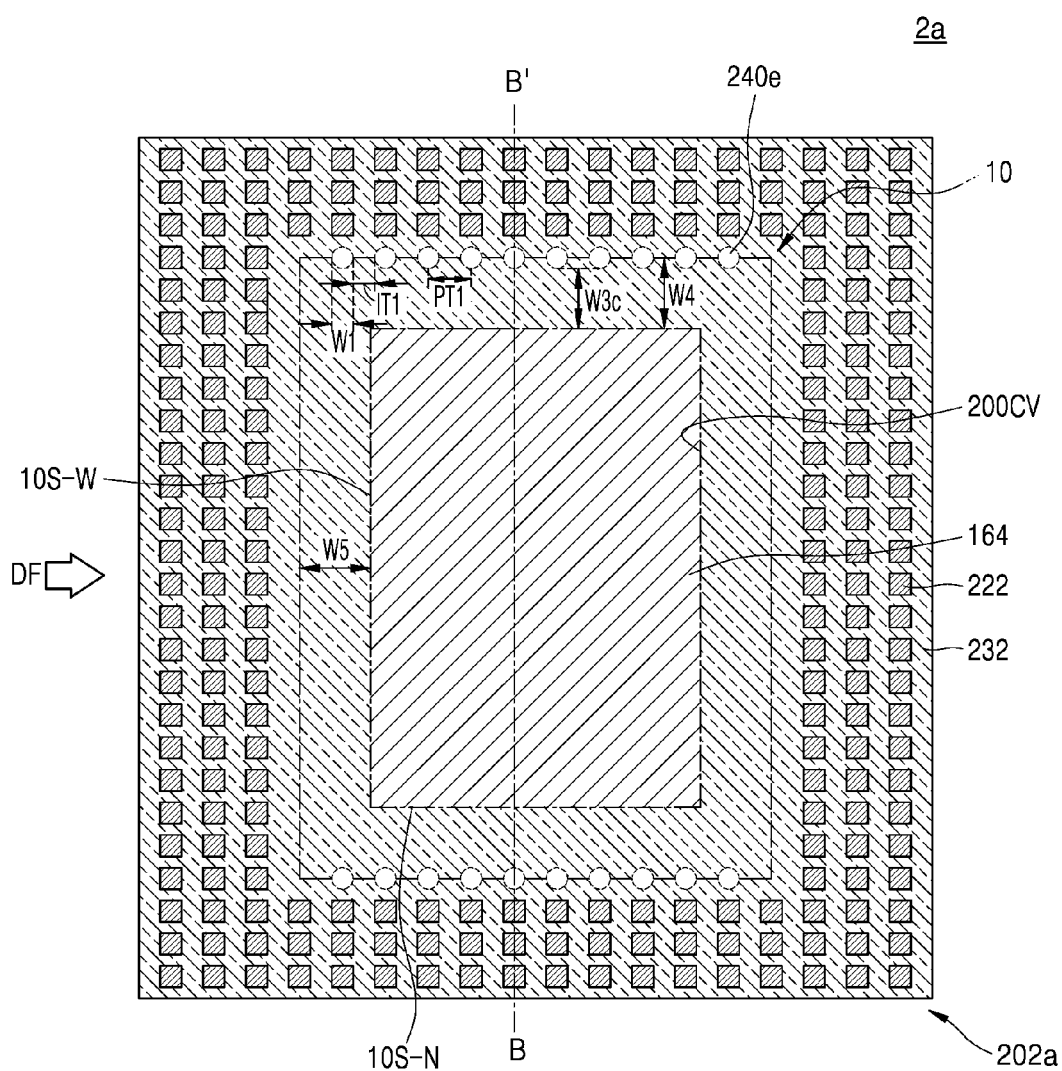
FIG. 4A is a top view of a semiconductor package according to exemplary embodiments of the inventive concept.
Figure 4B:
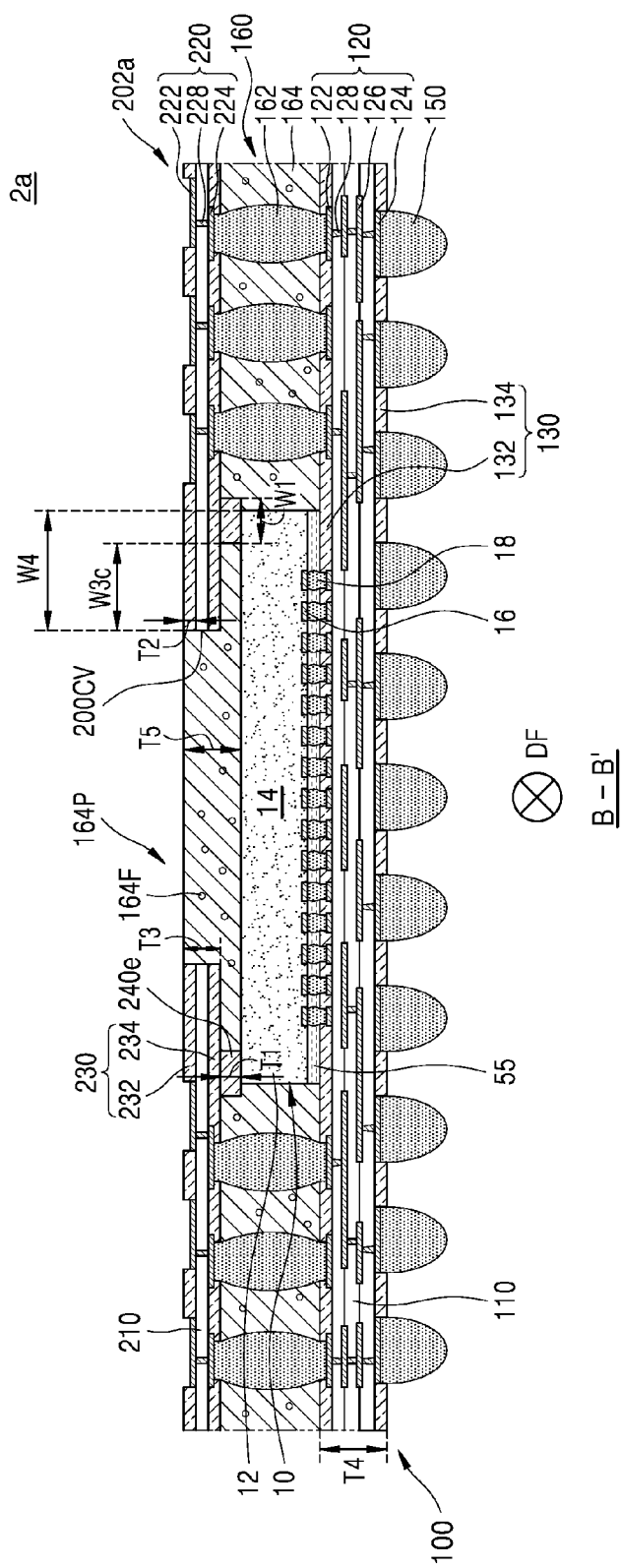
FIG. 4B is a cross-sectional view of the semiconductor package according to exemplary embodiments of the inventive concept.

FIG. 4A is a top view of a semiconductor package 2*a* according to exemplary embodiments of the inventive concept, and FIG. 4B is a cross-sectional view of the semiconductor package 2*a* according to exemplary embodiments of the inventive concept. FIG. 4B is a cross-sectional view taken along line B-B' of FIG. 4A. In FIGS. 4A and 4B, the same reference numerals as those of FIGS. 1A, 1B, 3A, and 3B may denote the same components, and thus, redundant descriptions may be omitted.

Referring to FIGS. 4A and 4B, the semiconductor package 2*a* may include the support wiring structure 100, the expanded layer 160 disposed on the support wiring structure 100, the semiconductor chip 10 disposed in the expanded layer 160, and a cover wiring structure 202*a* disposed on the expanded layer 160.

The cover wiring structure 202*a* may include the cavity 200CV penetrating from the upper surface to the lower surface near the center in a plane view. The cover wiring structure 202*a* may include a plurality of solder resist patches 240*e* disposed on the lower surface thereof. In some embodiments, the plurality of solder resist patches 240*e* may have a circular horizontal cross section. In some other embodiments, the plurality of second solder resist patches 240*e* may have a polygonal horizontal cross section similar to the plurality of solder resist patches 242 shown in FIG. 2A. In some embodiments, the plurality of second solder resist patches 240*e* may be a polygon having a horizontal cross section close to a circular shape. For example, the plurality of second solder resist patches 240*e* may have an octagonal, hexagonal, or pentagonal horizontal cross section, but are not limited thereto.

In some embodiments, the underfill layer 55 surrounding the plurality of chip connection terminals 18 may be interposed between the semiconductor chip 10 and the support wiring structure 100.

The first width W1 which is the maximum horizontal width of each of the plurality of solder resist patches 240*e* may be, for example, about 100 µm to about 300 µm. The plurality of solder resist patches 240*e* may have the first interval IT1, be spaced apart from each other, have the first pitch PT1, and be arranged in a row.

The plurality of solder resist patches 240*e* may be disposed to overlap the edge of the semiconductor chip 10 in the vertical direction. The plurality of solder resist patches 240*e* may be spaced apart by the third width W3 from the edge of the cavity 200CV. In some embodiments, the plurality of solder resist patches 240*e* may be disposed to overhang on the upper surface of the semiconductor chip 10. In other words, a part of the solder resist patch 240*e* may be in contact with the upper surface of the semiconductor chip 10 and another part of the solder resist patch 240*e* may extend beyond the edge of the semiconductor chip 10. The third width W3*c* may be less than the fourth width W4 and may be greater than a difference between the fourth width W4 and the first width W1.

In some embodiments, instead that the plurality of solder resist patches 240*e* are disposed to overlap the edge of the semiconductor chip 10 in the vertical direction in the semiconductor package 2*a*, the plurality of solder resist patches 240 shown in FIGS. 1A and 1B, the plurality of solder resist patches 242 shown in FIG. 2A, the plurality of solder resist patches 244 shown in FIG. 2B, the plurality of solder resist patches 240*a* shown in FIG. 2C, the plurality of solder resist patches 240*b* shown in FIG. 2D, or the plurality of solder resist patches 240*c* shown in FIG. 2E may be disposed to overlap the edge of the semiconductor chip 10 in the vertical direction.

Figure 5:
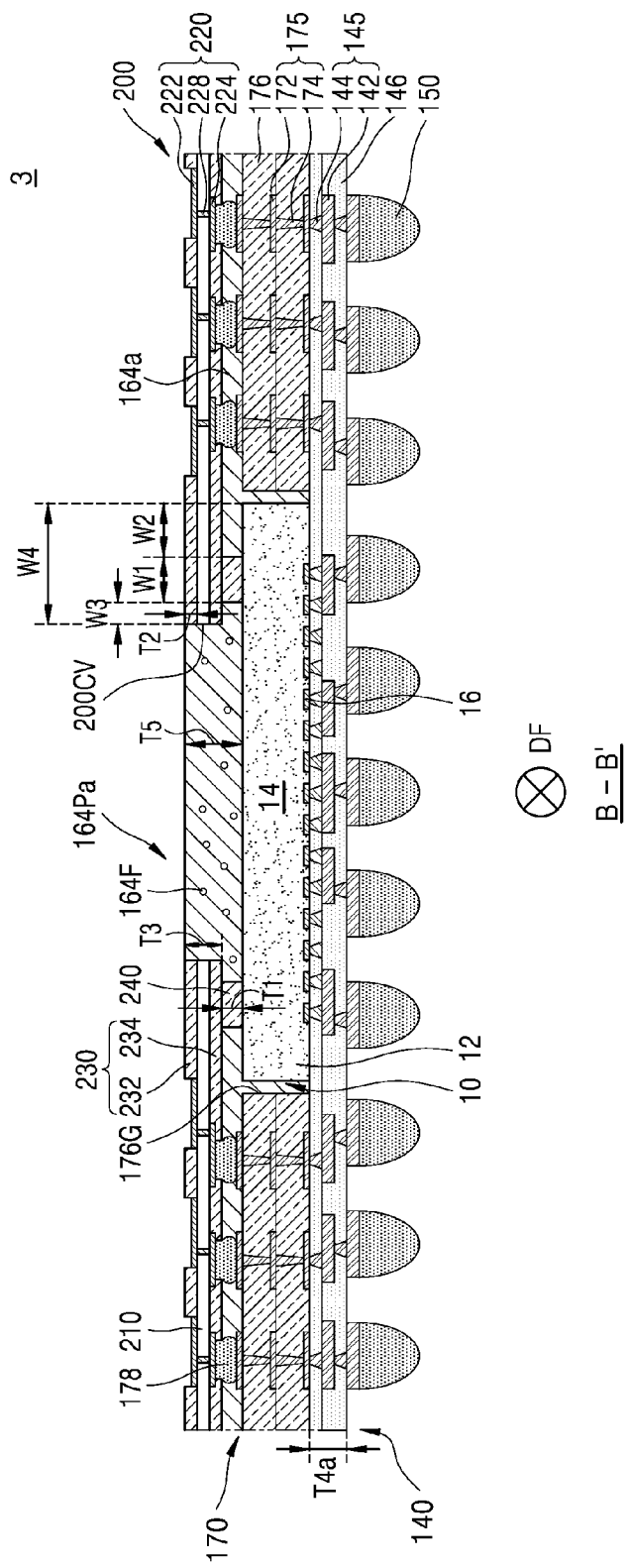
FIG. 5 is a cross-sectional view of a semiconductor package according to exemplary embodiments of the inventive concept.

FIG. 5 is a cross-sectional view of a semiconductor package 3 according to exemplary embodiments of the inventive concept. The top view of the semiconductor package 3 shown in FIG. 5 is substantially the same as the top view of the semiconductor package 1 shown in FIG. 1A, and FIG. 5 is cross-sectional view taken along a position corresponding to line B-B' in FIG. 1A. In FIG. 5, the same reference numerals as those of FIGS. 1A and 1B may denote the same components, and thus, redundant descriptions may be omitted.

Referring to FIG. 5, the semiconductor package 3 may include a support wiring structure 140, an expanded layer 170 including a mounting space 176G and disposed on the support wiring structure 140, the semiconductor chip 10 disposed in the mounting space 176G of the expanded layer 170, and the cover wiring structure 200 disposed on the expanded layer 170. The expanded layer 170 may surround the semiconductor chip 10.

The semiconductor package 3 may be a fan-out semiconductor package. In some embodiments, the expanded layer 170 may be a panel board, and the semiconductor package 3 may be a fan out panel level package (FOPLP). For example, the semiconductor package 3 may be a chip first FOPLP that forms the support wiring structure 140 after attaching the cover wiring layer 200 on the expanded layer 170. The support wiring structure 140 may be referred to as a redistribution layer.

In some embodiments, the horizontal width and the planar area of the mounting space 176G may have values greater than those of the horizontal width and planar area of the footprint of the semiconductor chip 10. In other words, the mounting space 176G is large enough to accommodate the semiconductor chip 10. The side surface of the semiconductor chip 10 may be spaced apart from the inner side surface of the mounting space 176G.

The support wiring structure 140 may include a redistribution conductive structure 145 and a plurality of redistribution insulating layers 146. Each of the redistribution conductive structure 145 and the redistribution insulating layer 146 may be respectively referred to as a first wiring pattern and a first base insulating layer. The redistribution conductive structure 145 may include a plurality of redistribution line patterns 142 disposed on at least one of the upper and lower surfaces of each of the plurality of redistribution insulating layers 146 and a plurality of redistribution vias 144 penetrating through at least one redistribution insulating layer 146 and connected to each other in contact with some of the plurality of redistribution line patterns 142. For example, redistribution line patterns 142 on opposite sides of the redistribution insulating layer 146 may be connected to each other through a redistribution via 144. In some embodiments, at least some of the plurality of redistribution line patterns 142 may be integrally formed together with some of the plurality of redistribution vias 144.

In some embodiments, the plurality of redistribution vias 144 may have a tapered shape extending from a lower side to an upper side with a horizontal width narrowing. In other words, a horizontal width of the plurality of redistribution vias 144 may increase while moving away from the semiconductor chip 10.

The plurality of chip connection pads 16 of the semiconductor chip 10 may be electrically connected to the redistribution conductive structure 145. In some embodiments, a part of the redistribution line pattern 142 disposed on the uppermost wiring layer among the plurality of redistribution line patterns 142 may contact the plurality of chip connection pads 16, but is not limited thereto. In some other embodiments, a part of the uppermost redistribution via 144 among the plurality of redistribution vias 144 may contact the plurality of chip connection pads 16.

The expanded layer 170 may be, for example, a PCB, a ceramic substrate, a package manufacturing wafer, or an interposer. In some embodiments, the expanded layer 170 may be a multilayer PCB. The mounting space 176G may be an opening or a cavity in the expanded layer 170. The mounting space 176G may be formed in a partial region of the expanded layer 170, for example, in the center region. The mounting space 176G may be recessed from the upper surface of the expanded layer 170 to a predetermined depth, or may be open by extending from the upper surface to the lower surface of the expanded layer 170. To recess or open the expanded layer 170, dry etching, wet etching, screen printing, a drill bit, or laser drilling may be used.

The expanded layer 170 may include a plurality of connection structures 175 and at least one substrate base 176. The connection structure 175 may include a connection wiring pattern 172 and a connection conductive via 174. The connection structure 175 and the substrate base 176 of the expanded layer 170 may include materials substantially similar to the second wiring pattern 220 and the second base insulating layer 210 of the cover wiring structure 200 respectively and may be formed similarly, and thus detailed descriptions thereof are omitted.

The semiconductor package 3 may further include a filling member 164a filling a space between the semiconductor chip 10 and the expanded layer 170 and between the expanded layer 170 and the cover wiring structure 200. The filling member 164a may surround the semiconductor chip 10. The filling member 164a may include, for example, an EMC. The filling member 164a may contain the filler 164F. For example, the filling member 164a may include an epoxy-based material containing the filler 164F. In some embodiments, the ratio of the filler 164F included in the filling member 164a may be about 55 wt % to about 85 wt %.

On the expanded layer 170, the cover wiring structure 200 including the second wiring pattern 220 electrically connected to the connection structure 175 and including the cavity 200CV is disposed. In some embodiments, a plurality of internal connection terminals 178 may be disposed between the connection structure 175 and the plurality of second lower pads 224 to electrically connect the connection structure 175 and the second wiring pattern 220. For example, the plurality of internal connection terminals 17 may be solder balls or bumps.

The filling member 164a may cover a side surface and an inactive surface of the semiconductor chip 10, in other words, a side surface and an upper surface of the semiconductor chip 10. The filling member 164a may surround side surfaces of the plurality of solder resist patches 240. The filling member 164 may have a filling protrusion 164Pa on a part of the upper surface of the semiconductor chip 10 that protrudes relatively compared to other parts. The filling protrusion 164Pa may fill the cavity 200CV of the cover wiring structure 200.

The uppermost end of the filling member 164a, in other words, the upper surface of the filling protrusion 164Pa and the uppermost end of the cover wiring structure 200, in other words, the upper surface of the second upper solder resist layer 232, may be located at the same vertical level and may be coplanar.

The cover wiring structure 200 may have the third thickness T3, and the support wiring structure 140 may have a fourth thickness T4a. In some embodiments, the fourth thickness T4a may be greater than the third thickness T3. The filling protrusion 164Pa may have the fifth thickness T5 on the semiconductor chip 10. For example, the filling protrusion 164Pa may have the fifth thickness T5 at the center of the semiconductor chip 10. The fifth thickness T5 may be greater than the third thickness T3.

In some embodiments, the semiconductor package 3 may include the plurality of solder resist patches 242 shown in FIG. 2A, the plurality of solder resist patches 244 shown in FIG. 2B, the plurality of solder resist patches 240a shown in FIG. 2C, the plurality of solder resist patches 240b shown in FIG. 2D, the plurality of solder resist patches 240c shown in FIG. 2E, the plurality of solder resist patches 240d shown in FIGS. 3A and 3B or the plurality of solder resist patches 240e shown in FIGS. 4A and 4B, instead of the plurality of solder resist patches 240.

Figure 6A:
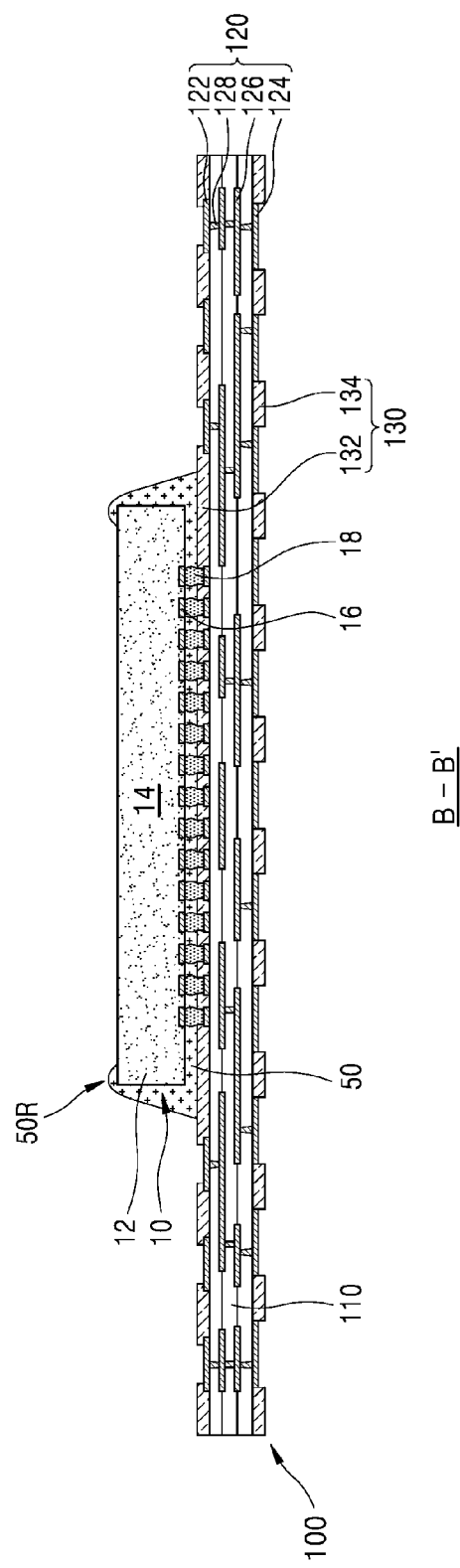
FIGS. 6A, 6B and 6C are cross-sectional views illustrating a method of manufacturing a semiconductor package according to exemplary embodiments of the inventive concept.
Figure 6B:
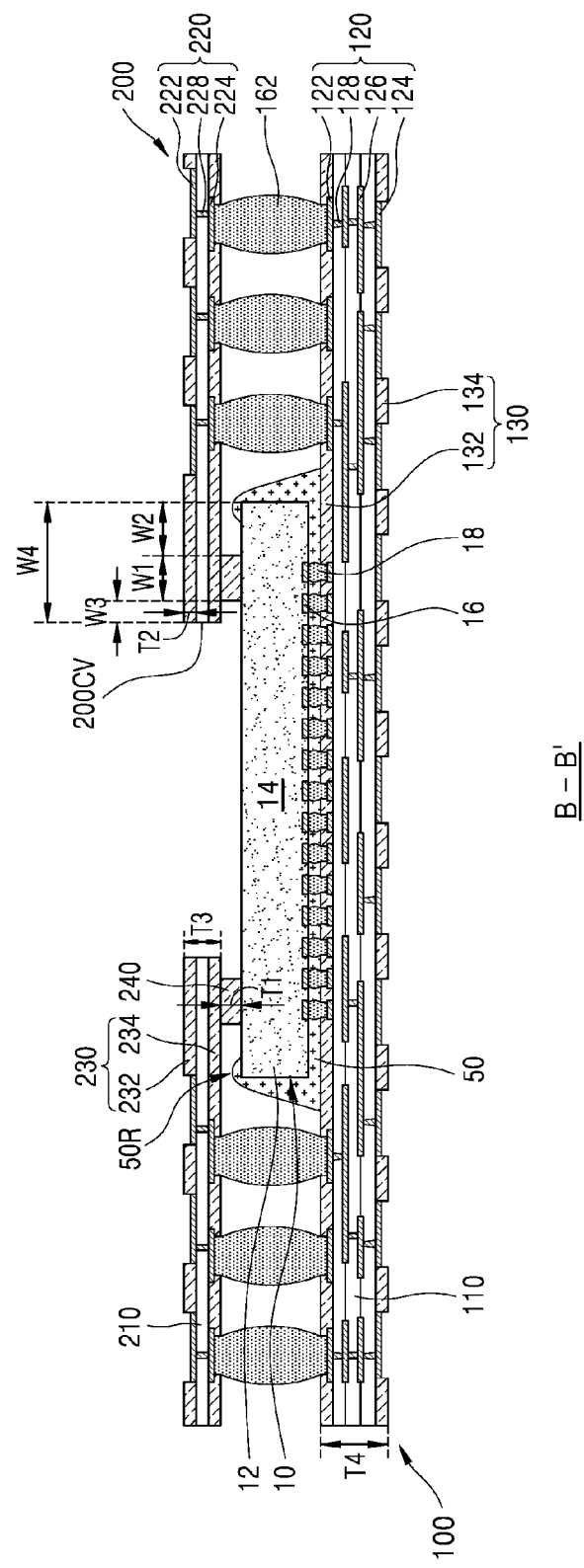
Figure 6C:
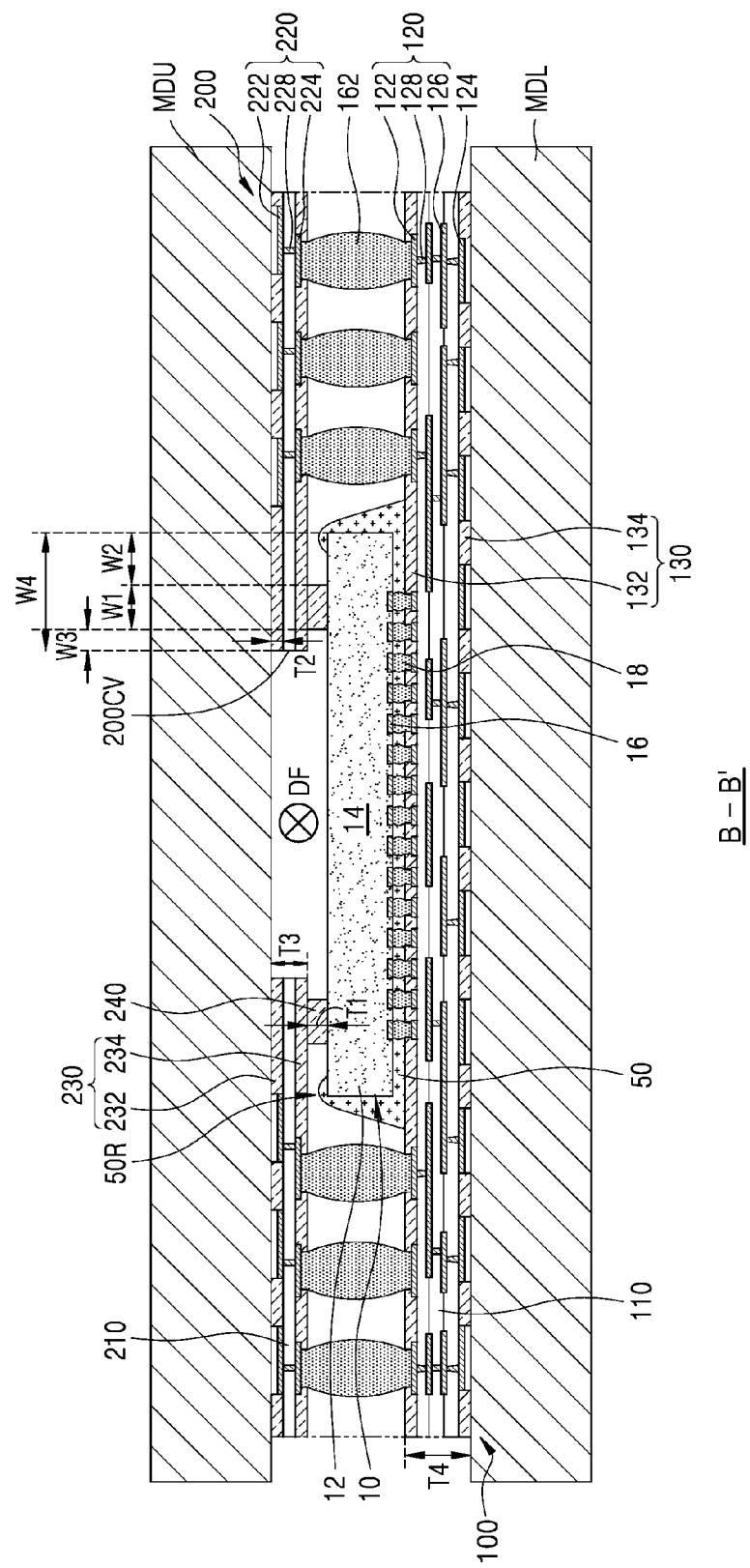

FIGS. 6A to 6C are cross-sectional views illustrating a method of manufacturing the semiconductor package 1 according to exemplary embodiments of the inventive concept. FIGS. 6A to 6C are cross-sectional views illustrating a method of manufacturing the semiconductor package 1 shown in FIGS. 1A and 1B and taken along a position corresponding to line B-B' of FIG. 1A. In FIGS. 6A to 6C, the same reference numerals as in FIGS. 1A and 1B may denote the same components, and thus, redundant descriptions may be omitted.

Referring to FIG. 6A, the semiconductor chip 10 is attached on the support wiring structure 100. The semiconductor chip 10 may be mounted on the support wiring structure 100 using a flip-chip in which an active surface of the semiconductor substrate 12 faces the support wiring structure 100.

The plurality of chip connection terminals 18 may be disposed between the plurality of chip connection pads 16 and some of the plurality of first upper pads 122 such that the semiconductor chip 10 and the plurality of first wiring patterns 120 of the support wiring structure 100 may be electrically connected.

The underfill layer 50 surrounding the plurality of chip connection terminals 18 may be interposed between the semiconductor chip 10 and the support wiring structure 100. The underfill layer 50 may include the projection 50R filling an area between the semiconductor chip 10 and the support wiring structure 100, extending along the side surface of the semiconductor chip 10 to the upper surface of the semiconductor chip 10, and covering the edge of the upper surface of the semiconductor chip 10, e.g., a part of the semiconductor chip 10 adjacent to the edge of the inactive surface of the semiconductor substrate 12. In some embodiments, the projection 50R may cover a part of about 50 μm to about 200 μm from the edge of the inactive surface, but is not limited thereto.

Referring to FIG. 6B, the cover wiring structure 200 including the cavity 200CV is attached on the support wiring structure 100 to which the semiconductor chip 10 is attached. The cover wiring structure 200 may be attached on the support wiring structure 100 with the plurality of connection structures 162 interposed therebetween. The plurality of connection structures 162 may electrically connect the support wiring structure 100 and the cover wiring structure 200.

In some embodiments, the plurality of connection structures 162 attached to the plurality of first upper pads 122 of the support wiring structure 100 may be formed and then the cover wiring structure 200 may be attached such that the plurality of second lower pads 224 and the plurality of connection structures 162 are connected. In some other embodiments, a lower portion of each of the plurality of connection structures 162 may be attached to any one of the plurality of first upper pads 122 of the support wiring structure 100, and an upper portion of each of the plurality of connection structures 162 may be attached to any one of the plurality of second lower pads 224 of the cover wiring structure 200 and then the cover wiring structure 200 to which the upper portion is attached may be attached to the support wiring structure 100 to which the lower portion is attached such that the upper portion and the lower portion contact each other.

The cover wiring structure 200 may include the plurality of solder resist patches 240 disposed on the lower surface thereof. In the cover wiring structure 200, the plurality of solder resist patches 240 may be spaced apart from the edge of the semiconductor chip 10 by the second width W2, disposed in contact with the inactive surface of the semiconductor chip 10, in other words, the upper surface of the semiconductor chip 10, and attached to the semiconductor chip 10 to be spaced apart from each other without contacting the projection 50R of the underfill layer 50. For example, the a first solder resist patch 240 may be disposed at the left edge of the semiconductor chip 10 and a second solder resist patch 240 may be disposed at the right edge of the semiconductor chip 10, as shown in FIG. 6B.

Referring to FIG. 6C, the upper mold MDU is disposed to cover the upper surface of the cover wiring structure 200. In some embodiments, the upper mold MDU covering the upper surface of the cover wiring structure 200 and a lower mold MDL covering the lower surface of the support wiring structure 100 may be disposed together.

Even when pressure is applied to the cover wiring structure 200 by the upper mold MDU, the part of the cover wiring structure 200 adjacent to the cavity 200CV and overlapping the semiconductor chip 10, may be maintained with an interval equal to the first thickness T1 due to the plurality of solder resist patches 240.

Thereafter, the filling member 164 shown in FIG. 1B may be injected between the support wiring structure 100 and the cover wiring structure 200 along the injection direction DF. Since the plurality of solder resist patches 240 are disposed between the second lower solder resist layer 234 and the semiconductor chip 10 to maintain an interval between the part of the cover wiring structure 200 adjacent to the cavity 200CV and the semiconductor chip 10, the filling member 164 may be smoothly injected along this space, and thus, a void in which the filling member 164 is not filled may be prevented from occurring.

The injection direction DF may be the minor axis direction of the semiconductor chip 10, in other words, the injection direction DF may be an extension direction of the second side surface 10S-N of the semiconductor chip 10 shown in FIG. 1A. The plurality of solder resist patches 240 may be spaced apart from each other along the injection direction DF and may be arranged in a row. Accordingly, the plurality of solder resist patches 240 may not prevent the filling member 164 from being injected between the cover wiring structure 200 and the semiconductor chip 10.

While the upper mold MDU covers the upper surface of the cover wiring structure 200, because the filling member 164 is provided, the uppermost end of the filling member 164, in other words, the upper surface of the filling protrusion 164P and the uppermost end of the cover wiring structure 200, in other words, the upper surface of the second upper solder resist layer 232, may be located at the same vertical level and may be coplanar.

In some embodiments, by heat applied in a process of forming the filling member 164, the upper and lower portions of each of the plurality of connection structures 162 may reflow and be soldered to form one body.

Thereafter, the upper mold MDU and the lower mold MDL may be removed, the plurality of external connection terminals 150 may be attached to the plurality of first lower pads 124 as shown in FIG. 1B, and thus the semiconductor package 1 may be formed.

FIGS. 7A to 7D are cross-sectional views illustrating a method of manufacturing the semiconductor package 3 according to exemplary embodiments of the inventive concept. FIGS. 7A to 7D are cross-sectional views illustrating a method of manufacturing the semiconductor package 3 shown in FIG. 5 and taken along a position corresponding to line B-B' of FIG. 1A.

Figure 7A:
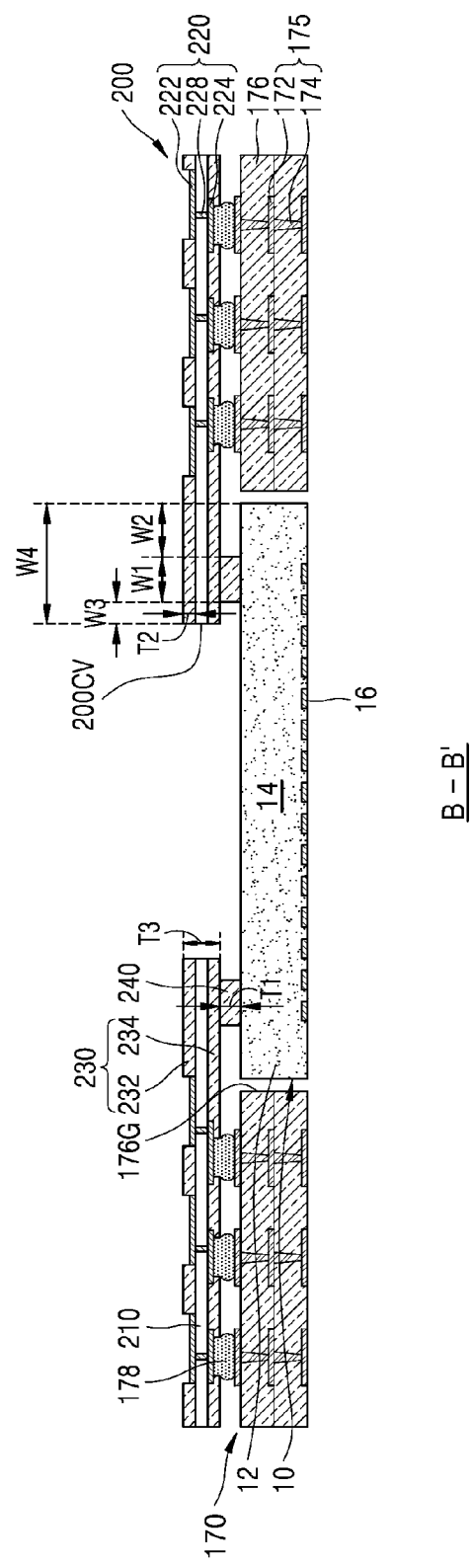

Referring to FIG. 7A, after preparing the expanded layer 170 including the mounting space 176G, the semiconductor chip 10 is disposed in the mounting space 176G of the expanded layer 170. In some embodiments, the expanded layer 170 may be a panel board. The semiconductor chip 10 may be disposed in the mounting space 176G of the expanded layer 170 such that the side surface of the semiconductor chip 10 is spaced apart from the inner surface of the mounting space 176G. For example, the semiconductor chip 10 may be attached to a support substrate exposed through the mounting space 176G of the expanded layer 170 after attaching the expanded layer 170 to the support substrate.

The cover wiring structure 200 including the cavity 200CV is attached to the expanded layer 170 in which the semiconductor chip 10 is disposed in the mounting space 176G. The cover wiring structure 200 may be attached to the expanded layer 170 such that the plurality of internal connection terminals 178 are disposed between the plurality of second lower pads 224 and the connection structure 175 of the expanded layer 170 such that the connection structure 175 and the second wiring pattern 220 are electrically connected.

The cover wiring structure 200 may further include the plurality of solder resist patches 240 disposed on the lower surface thereof. The plurality of solder resist patches 240 may be disposed between the second lower solder resist layer 234 and the semiconductor chip 10 to maintain an interval between the cover wiring structure 200 and the semiconductor chip 10.

Referring to FIG. 7B, the upper mold MDU is disposed to cover the upper surface of the cover wiring structure 200. In some embodiments, the upper mold MDU covering the upper surface of the cover wiring structure 200 and the lower mold MDL covering the expanded layer 170 and the lower surface of the semiconductor layer 10 may be disposed together.

When pressure is applied to the cover wiring structure 200 by the upper mold MDU, an interval equal to the first thickness T1 between the part of the cover wiring structure 200 adjacent to the cavity 200CV and overlapping the semiconductor chip 10, may be maintained by the plurality of solder resist patches 240.

Thereafter, the filling member 164a shown in FIG. 5 may be injected between the support wiring structure 100 and the cover wiring structure 200 along the injection direction DF. The plurality of solder resist patches 240 may be disposed between the second lower solder resist layer 234 and the semiconductor chip 10 to maintain the interval between the part of the cover wiring structure 200 and the semiconductor chip 10, and thus, the filling member 164a may be smoothly injected along the interval between the cover wiring structure 200 and the semiconductor chip 10. Therefore, a void in which the filling member 164a is not filled may be prevented from occurring.

While the upper mold MDU covers the upper surface of the cover wiring structure 200, because the filling member 164a is formed, the uppermost end of the filling member 164a, in other words, the upper surface of the filling protrusion 164Pa and the uppermost end of the cover wiring structure 200, in other words, the upper surface of the second upper solder resist layer 232, may be located at the same vertical level and may be coplanar.

Figure 7C:
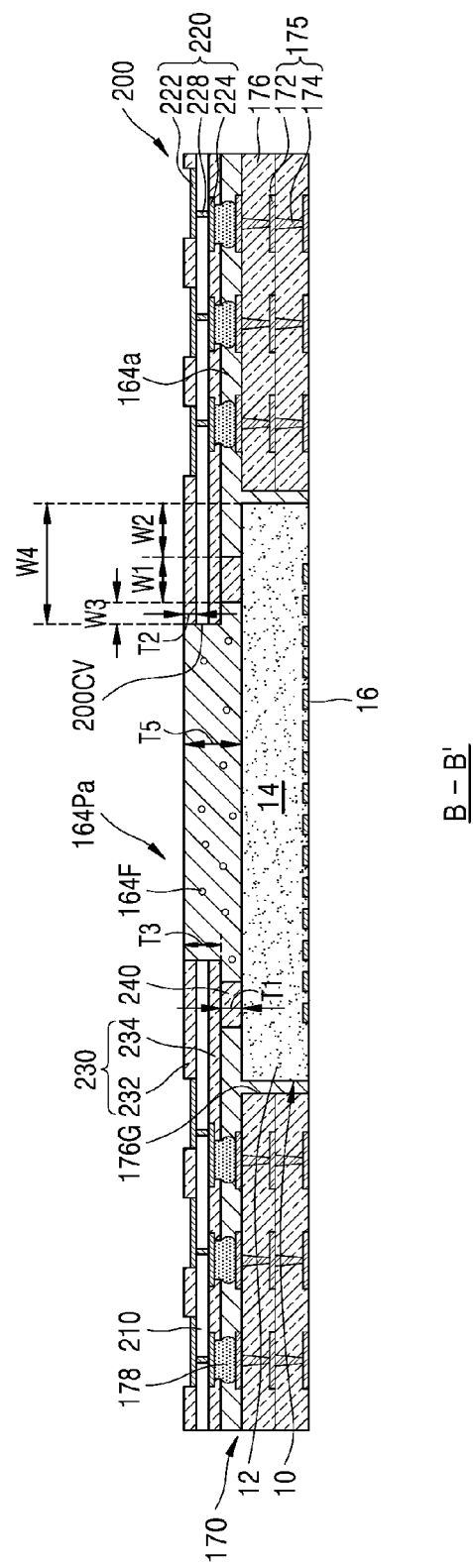

Referring to FIGS. 7B and 7C, after forming the filling member 164a, the upper mold MDU and the lower mold MDL may be removed.

Figure 7D:
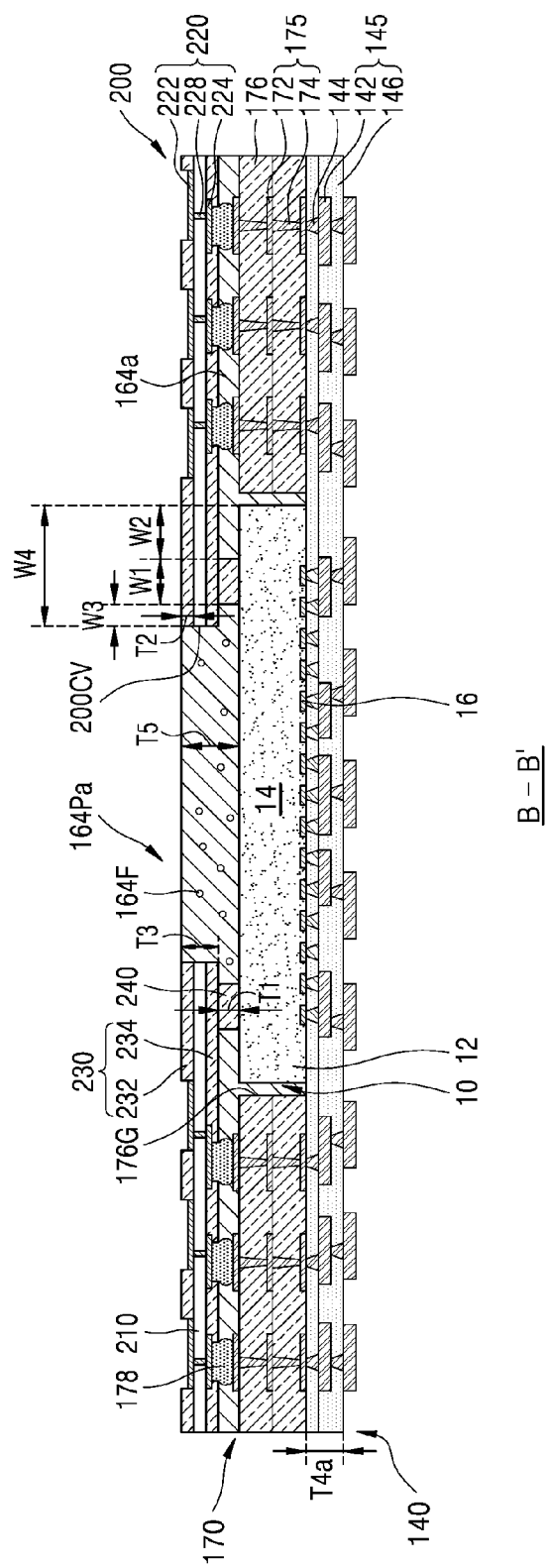

Referring to FIG. 7D, the support wiring structure 140 is formed on the lower surfaces of the expanded layer 170, the semiconductor chip 10, and the filling member 164a. For example, after the resultant structure of FIG. 7C is turned upside down and attached on the support substrate with a release film attached, the support wiring structure 140 may be formed on the expanded layer 170, the semiconductor chip 10, and the filling member 164a. In some embodiments, the support wiring structure 140 may be a redistribution layer.

The support wiring structure 140 may include the redistribution conductive structure 145 and the plurality of redistribution insulating layers 146. The redistribution conductive structure 145 may include the plurality of redistribution line patterns 142 disposed on at least one of the upper and lower surfaces of each of the plurality of redistribution insulating layers 146 and the plurality of redistribution vias 144 penetrating through at least one redistribution insulating layer 146 and connected to each other in contact with some of the plurality of redistribution line patterns 142.

The support wiring structure 140 may be formed by sequentially stacking each of the plurality of redistribution insulating layers 146 and the redistribution line pattern 142, or the redistribution via 144 and the redistribution line pattern 142.

For example, a specific method of manufacturing the support wiring structure 140 is as follows. First, the redistribution insulating layer 146 exposing a part of the connection wiring pattern 172 of the wiring structure 175 and a part of the plurality of chip connection pads 16 of the semiconductor chip 10 is formed, The connection wiring pattern 172, the redistribution via 144 connected to the chip connection pad 16 and the redistribution line pattern 142 connected to the redistribution via 144 on the redistribution insulating layer 146 of the lowermost layer are formed. In this case, the redistribution line pattern 142 connected to the redistribution via 144 and the redistribution via 144 may be integrally formed. By repeating this process, the support wiring structure 140 including the redistribution conductive structure 145 and the plurality of redistribution insulating layers 146 and including a plurality of wiring layers may be formed.

In some embodiments, each of the plurality of redistribution insulating layers 146 may be formed from a material film including an organic compound. In some embodiments, each of the plurality of redistribution insulating layers 146 may be formed from a material film including an organic polymer material. In some embodiments, each of the plurality of redistribution insulating layers 146 may be formed from photosensitive polyimide (PSPI).

Each of the redistribution line pattern 142 and the redistribution via 144 may be metal such as copper (Cu), tungsten (W), titanium (Ti), titanium tungsten (TiW), titanium nitride (TiN), tantalum (Ta), tantalum nitride (TaN), chromium (Cr), aluminum (Al), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), and the like, an alloy thereof, or a metal nitride, but is not limited thereto.

Each of the redistribution line pattern 142 and the redistribution via 144 may include a seed layer in contact with the redistribution insulating layer 146 and a conductive material layer on the seed layer. In some embodiments, the seed layer may be formed by performing physical vapor deposition, and the conductive material layer may be formed by performing electroless plating. In some embodiments, the seed layer may be Cu/Ti in which copper is stacked on titanium, or Cu/TiW in which copper is stacked on titanium tungsten. In some embodiments, when copper (Cu) is used as the redistribution line pattern 142 and the redistribution via pattern 144, at least a part of the seed layer may function as a diffusion barrier layer.

A part of the redistribution line pattern 142 may be integrally formed together with a part of the redistribution via 144. For example, the redistribution line pattern 142 may be integrally formed together with a part of the redistribution via 144 in contact with the upper side of the redistribution line pattern 142 or a part of the redistribution via 144 in contact with the lower side of the redistribution line pattern 142.

In some embodiments, each of the plurality of redistribution vias 144 may have a tapered shape extending from a lower side to an upper side with a horizontal width narrowing. In other words, each of the plurality of redistribution vias 144 may have the horizontal width increasing while moving away from the semiconductor chip 10.

Thereafter, as shown in FIG. 5, the semiconductor package 3 may be formed by attaching the plurality of external connection terminals 150 to parts of the redistribution line pattern 142 of the lowermost layer.

FIGS. 8 to 11 are cross-sectional views of package-on-packages 1000, 2000, 2000a, and 3000 including semiconductor packages according to exemplary embodiments of the inventive concept.

Figure 8:
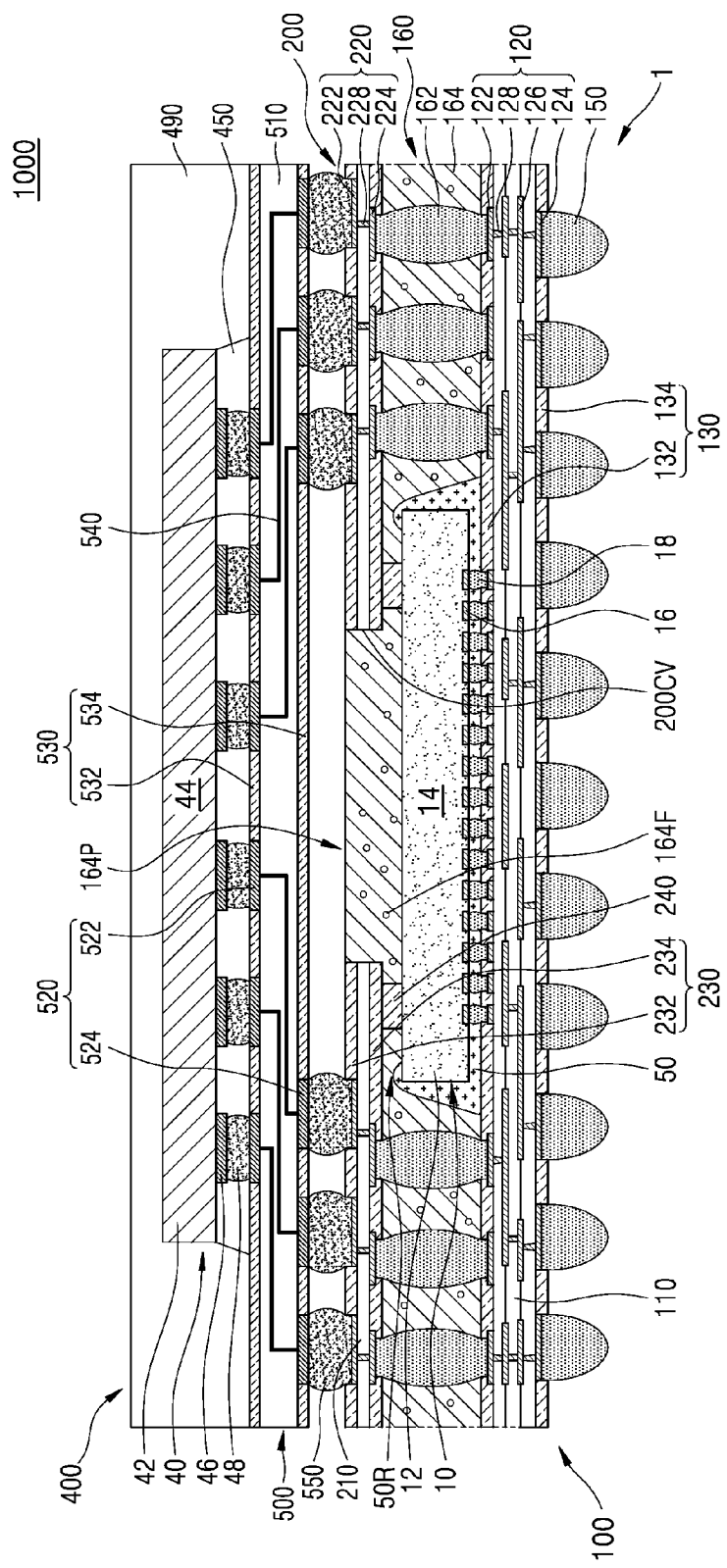
FIGS. 8, 9, 10 and 11 are cross-sectional views of package-on-packages including semiconductor packages according to exemplary embodiments of the inventive concept.

Referring to FIG. 8, the package-on-package 1000 may include a second semiconductor package 400 stacked on the first semiconductor package 1. The first semiconductor package 1 may be a lower semiconductor package, and the second semiconductor package 400 may be an upper semiconductor package. The first semiconductor package 1, the first semiconductor chip 10, the first semiconductor substrate 12, the first semiconductor device 14, the first chip connection pad 16, the first chip connection terminal 18, and the first underfill layer 50 are substantially the same as the semiconductor package 1, the semiconductor chip 10, the semiconductor substrate 12, the semiconductor device 14, the chip connection pad 16, the chip connection terminal 18, and the underfill layer 50 described with reference to FIGS. 1A and 1B respectively, and thus detailed descriptions thereof will be omitted.

The second semiconductor package 400 may include at least one second semiconductor chip 40. The second semiconductor package 400 may be electrically connected to the first semiconductor package 1 through a plurality of package connection terminals 550 attached to the plurality of second upper pads 222 of the first semiconductor package 1 exposed without being covered by the upper solder resist layer 232.

The second semiconductor chip 40 may include a second semiconductor substrate 42 having an active surface on which a second semiconductor device 44 is formed, and a plurality of second chip connection pads 46 disposed on the active surface of the second semiconductor substrate 42. The second semiconductor substrate 42, the second semiconductor device 44, and the second chip connection pads 46 are substantially similar to the semiconductor substrate 12, the semiconductor device 14, and the chip connection pads 16 described with reference to FIGS. 1A and 1B respectively, and thus redundant descriptions will be omitted.

The at least one second semiconductor chip 40 may be a memory semiconductor chip. The second semiconductor chip 40 may be, for example, a DRAM chip, an SRAM chip, a flash memory chip, an EEPROM chip, a PRAM chip, an MRAM chip, or an RRAM chip.

In FIG. 8, the at least one second semiconductor chip 40 of the second semiconductor package 400 is mounted on a package base substrate 500 using a flip-chip, but this is merely exemplary and the inventive concept is not limited thereto. The package-on-package 1000 may include all types of semiconductor packages including the at least one second semiconductor chip 40 and the package connection terminal 550 attached to the lower side to be electrically connected to the first semiconductor package 1 as the upper semiconductor package.

The package base substrate 500 may include a base board layer 510 and a plurality of board pads 520 disposed on upper and lower surfaces of the base board layer 510. The plurality of board pads 520 may include a plurality of board upper pads 522 disposed on the upper surface of the base board layer 510 and a plurality of board lower pads 524 disposed on the lower surface of the base board layer 510. In some embodiments, the package base substrate 500 may be a PCB. For example, the package base substrate 500 may be a multilayer PCB. The base board layer 510 may include at least one material selected from phenol resin, epoxy resin, and polyimide.

A board solder resist layer 530 exposing the plurality of board pads 520 may be formed on the upper and lower surfaces of the base board layer 510. The board solder resist layer 530 may include an upper board solder resist layer 532 covering the upper surface of the base board layer 510 and exposing the plurality of board upper pads 522 and a lower board solder resist layer 534 covering the lower surface of the base board layer 510 and exposing the plurality of board lower pads 524.

The package base substrate 500 may include a board wiring 540 electrically connecting the plurality of board upper pads 522 and the plurality of board lower pads 524 within the base board layer 510. The board wiring 540 may include a board wiring line and a board wiring via. The board wiring 540 may include copper, nickel, stainless steel, or beryllium copper. In some embodiments, the board wiring 540 may also be disposed between the upper surface of the base board layer 510 and the upper board solder resist layer 532, and/or between the lower surface of the base board layer 510 and the lower surface of the lower board solder resist layer 534.

The plurality of board upper pads 522 may be electrically connected to the second semiconductor chip 40. For example, a plurality of second chip connection terminals 48 may be disposed between the plurality of second chip connection pads 46 of the second semiconductor chip 40 and the plurality of board upper pads 522 of the package base substrate 500 such that the second semiconductor chip 40 and the package base substrate 500 may be electrically connected to each other. In some embodiments, a second underfill layer 450 surrounding the plurality of second chip connection terminals 48 may be interposed between the second semiconductor chip 40 and the package base substrate 500. The second underfill layer 450 may include, for example, an epoxy resin formed by using a capillary underfill. In some embodiments, the second underfill layer 450 may be a non-conductive film.

A molding layer 490 surrounding the second semiconductor chip 40 may be disposed on the package base substrate 500. The molding layer 490 may include, for example, an EMC. In some embodiments, the molding layer 490 may cover an inactive surface of the second semiconductor chip 40. In some other embodiments, the molding layer 490 may cover a side surface of the second semiconductor chip 40 but may not cover the inactive surface, and a heat dissipation member may be attached to the inactive surface of the second semiconductor chip 40.

In some embodiments, the package-on package 1000 may include the semiconductor package 1a shown in FIG. 2A, the semiconductor package 1b shown in FIG. 2B, the semiconductor package 1c shown in FIG. 2C, the semiconductor package 1d shown in FIG. 2D, or the semiconductor package 1e shown in FIG. 2E, instead of the first semiconductor package 1.

Figure 9:
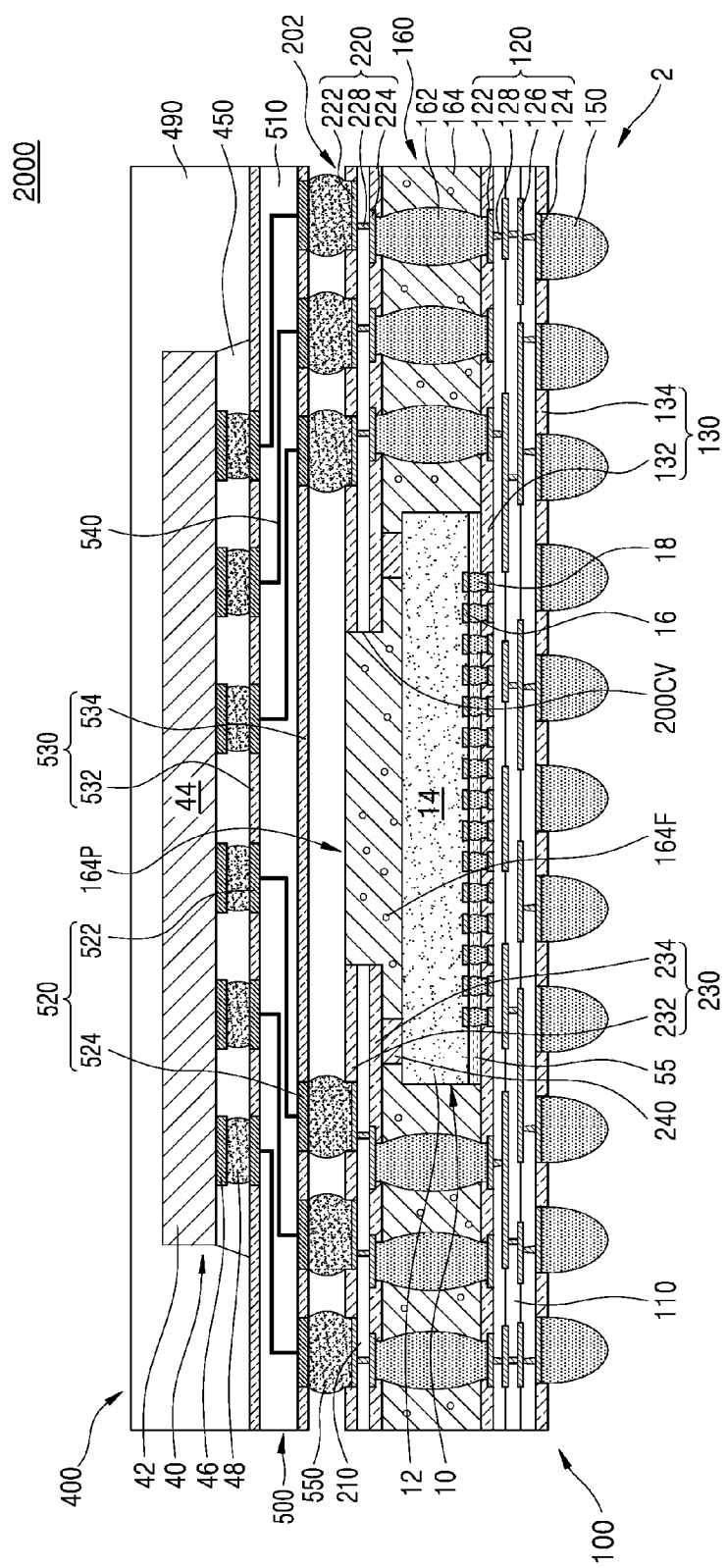

Referring to FIG. 9, the package-on-package 2000 may include the second semiconductor package 400 stacked on the first semiconductor package 2. The first semiconductor package 2 may be a lower semiconductor package, and the second semiconductor package 400 may be an upper semiconductor package. The first semiconductor package 2 may be substantially the same as the semiconductor package 2 described with reference to FIGS. 3A and 3B, and the second semiconductor package 400 may be substantially the same as the second semiconductor package 400 described with reference to FIG. 8, and thus detailed descriptions thereof will be omitted.

In some embodiments, the semiconductor package 2 included in the package-on-package 2000 may include the plurality of solder resist patches 240 shown in FIGS. 1A and 1B, the plurality of solder resist patches 242 shown in FIG. 2A, the plurality of solder resist patches 244 shown in FIG. 2B, the plurality of solder resist patches 240a shown in FIG. 2C, the plurality of solder resist patches 240b shown in FIG. 2D, or the plurality of solder resist patches 240c shown in FIG. 2E, instead of the plurality of solder resist patches 240.

Figure 10:
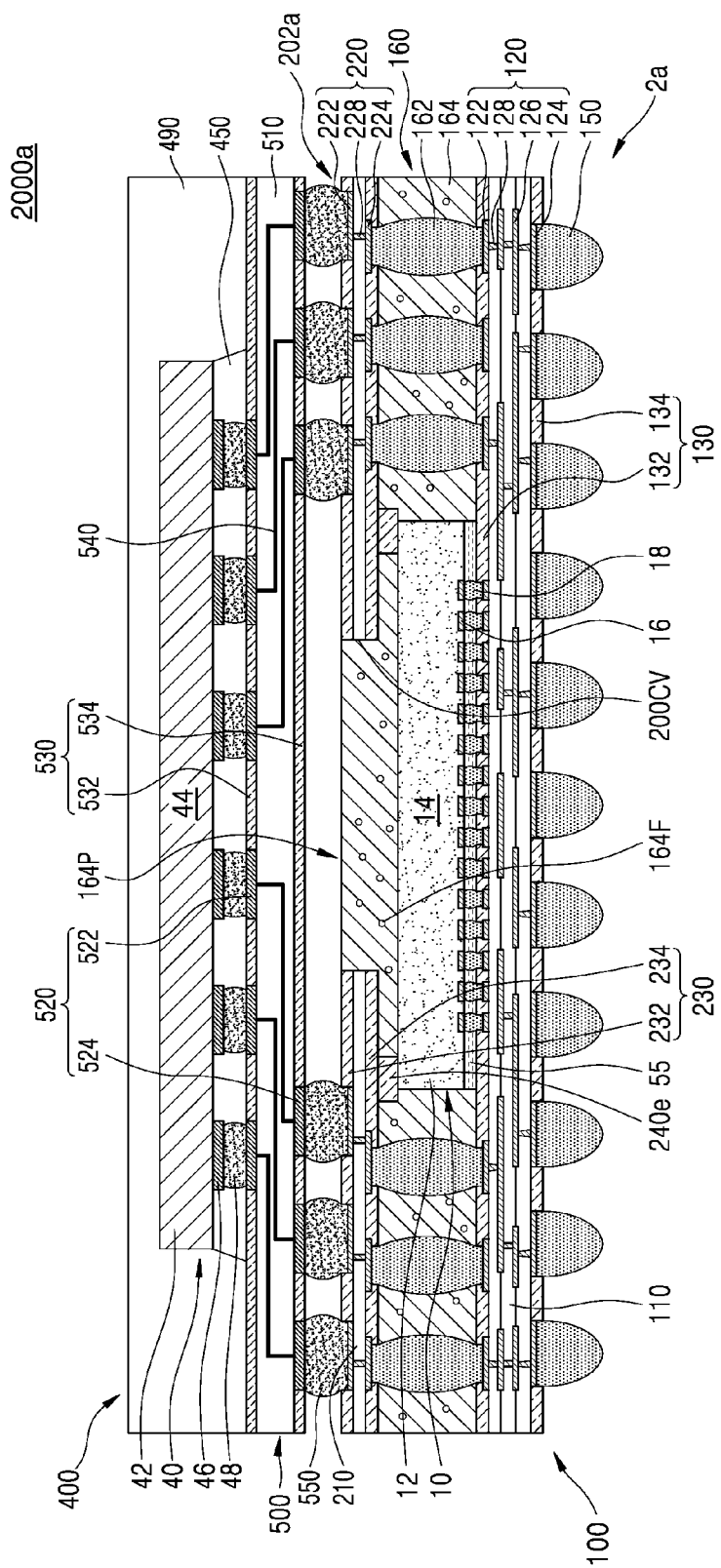

Referring to FIG. 10, the package-on-package 2000a may include the second semiconductor package 400 stacked on the first semiconductor package 2a. The first semiconductor package 2a may be a lower semiconductor package, and the second semiconductor package 400 may be an upper semiconductor package. The first semiconductor package 2a may be substantially the same as the semiconductor package 2a described with reference to FIGS. 4A and 4B, and the second semiconductor package 400 may be substantially the same as the second semiconductor package 400 described with reference to FIG. 8, and thus detailed descriptions thereof will be omitted.

In some embodiments, instead of the plurality of solder resist patches 240e, the plurality of solder resist patches 240 shown in FIGS. 1A and 1B, the plurality of solder resist patches 242 shown in FIG. 2A, the plurality of solder resist patches 244 shown in FIG. 2B, the plurality of solder resist patches 240a shown in FIG. 2C, the plurality of solder resist patches 240b shown in FIG. 2D, or the plurality of solder resist patches 240c shown in FIG. 2E may overlap the edge of the semiconductor chip 10 in the vertical direction.

Figure 11:
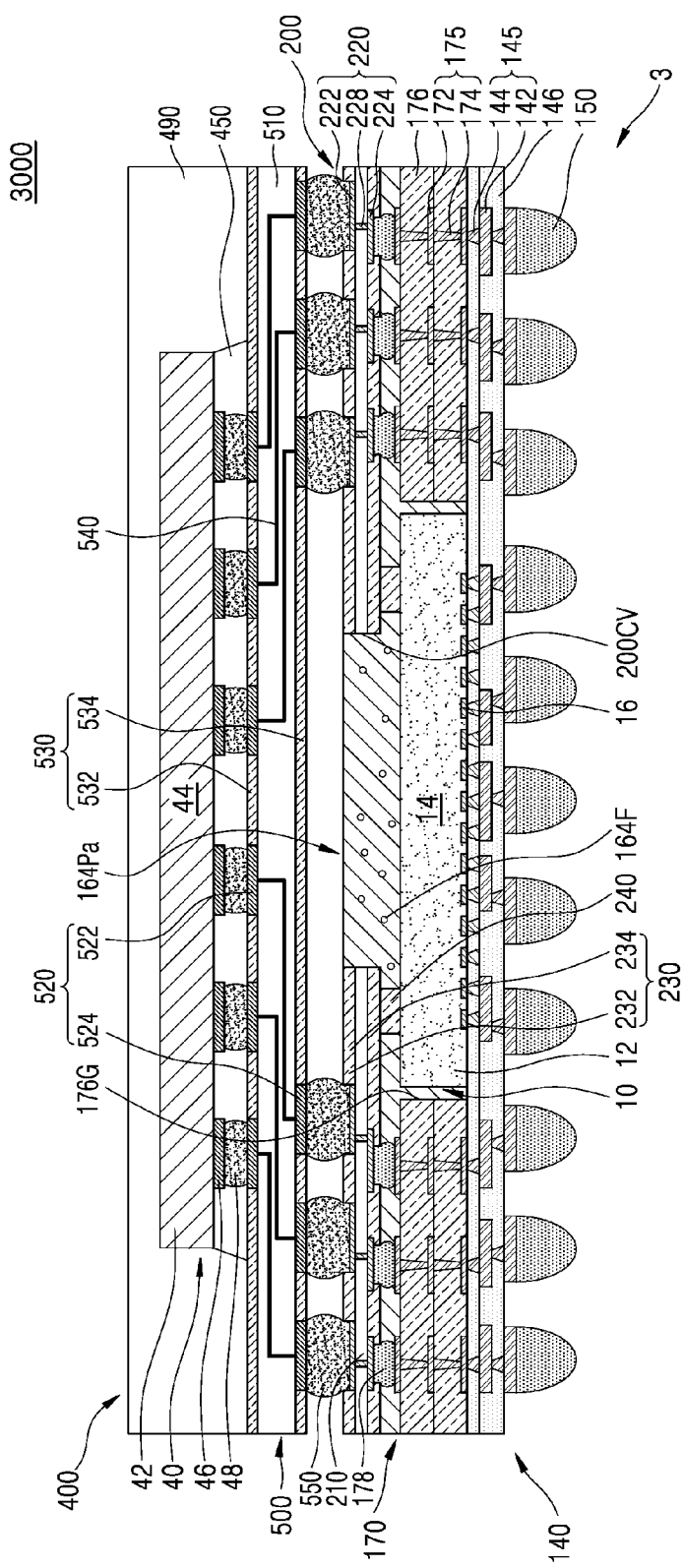

Referring to FIG. 11, the package-on-package 3000 may include the second semiconductor package 400 stacked on the first semiconductor package 3. The first semiconductor package 3 may be a lower semiconductor package, and the second semiconductor package 400 may be an upper semiconductor package. The first semiconductor package 3 may be substantially the same as the semiconductor package 3 described with reference to FIG. 5, and the second semiconductor package 400 may be substantially the same as the second semiconductor package 400 described with reference to FIG. 8, and thus detailed descriptions thereof will be omitted.

In some embodiments, the semiconductor package 3 included in the package-on-package 3000 may include the plurality of solder resist patches 242 shown in FIG. 2A, the plurality of solder resist patches 244 shown in FIG. 2B, the plurality of solder resist patches 240a shown in FIG. 2C, the plurality of solder resist patches 240b shown in FIG. 2D, the plurality of solder resist patches 240c shown in FIG. 2E, the plurality of solder resist patches 240d shown in 3B or the plurality of solder resist patches 240e shown in FIGS. 4A and 4B, instead of the plurality of solder resist patches 240.

Exemplary embodiments of the inventive concept provide a semiconductor package that provides a reliable electrical connection between upper and lower portions and is disposed on the lower portion when the semiconductor package is stacked on the upper portion, and a package-on-package type semiconductor package including the semiconductor package.

While the inventive concept has been particularly shown and described with reference to exemplary embodiments thereof, it will be understood that various changes in form and details may be made thereto without departing from the spirit and scope of the inventive concept as set forth in the following claims.

What is claimed is:
1. A semiconductor package, comprising:
a first wiring structure;
a semiconductor chip disposed on the first wiring structure;
a second wiring structure disposed on the semiconductor chip and comprising a cavity; and
a filling member between the first wiring structure and the second wiring structure and in the cavity,
wherein an uppermost end of the filling member and an uppermost end of the second wiring structure are located at the same level from a first side of the cavity to a second side of the cavity opposite the first side.
2. The semiconductor package of claim 1, wherein a planar area of the cavity is smaller than that of the semiconductor chip.
3. The semiconductor package of claim 1, wherein the cavity does not overlap an edge of the semiconductor chip.
4. The semiconductor package of claim 1, wherein the semiconductor chip comprises two first side surfaces opposite to each other, and two second side surfaces opposite to each other, each of the two second side surfaces having an extension length greater than that of each of the two first side surfaces and being connected between the two first side surfaces, and
wherein the second wiring structure comprises a plurality of solder resist patches contacting an upper surface of the semiconductor chip.
5. The semiconductor package of claim 4, wherein each of the plurality of solder resist patches has a first width, and
each of the plurality of solder resist patches is spaced apart from an edge of the semiconductor chip by a second width greater than the first width.

6. The semiconductor package of claim 4, wherein the plurality of solder resist patches are spaced apart from each other along each of the two second side surfaces of the semiconductor chip and are arranged in a row.

7. The semiconductor package of claim 4, wherein the plurality of solder resist patches comprises a plurality of first solder resist patches having a first pitch along each of the two second side surfaces of the semiconductor chip, wherein the plurality of first solder resist patches are spaced apart from each other, and arranged in a row, and a plurality of second solder resist patches having a second pitch greater than that of the first pitch along each of the two first side surfaces of the semiconductor chip, wherein the plurality of second solder resist patches are spaced apart from each other, and arranged in a row.

8. The semiconductor package of claim 4, wherein the plurality of solder resist patches comprises four solder resist patches, wherein the four solder resist patches are disposed at different corners of the semiconductor chip.

9. The semiconductor package of claim 4, wherein the second wiring structure comprises at least one base insulating layer, a plurality of upper pads and a plurality of lower pads respectively disposed on an upper surface and a lower surface of the at least one base insulating layer, an upper solder resist layer covering the upper surface of the at least one base insulating layer and exposing the plurality of upper pads, a lower solder resist layer covering the lower surface of the at least one base insulating layer and exposing the plurality of lower pads, and a plurality of solder resist patches disposed between the lower solder resist layer and the semiconductor chip, and wherein a first thickness of each of the plurality of solder resist patches is greater than a second thickness of each of the upper solder resist layer and the lower solder resist layer.

10. The semiconductor package of claim 4, further comprising an underfill layer interposed between the semiconductor chip and the first wiring structure, wherein the underfill layer comprises a projection extending from between the semiconductor chip and the first wiring structure onto the upper surface of the semiconductor chip, and wherein the plurality of solder resist patches are spaced apart from each other without contacting the projection.

11. A semiconductor package, comprising:

a support wiring structure comprising a plurality of first base insulating layers and a plurality of first wiring patterns;

a semiconductor chip disposed on the support wiring structure and electrically connected to a first portion of the plurality of first wiring patterns;

a cover wiring structure disposed on the semiconductor chip and comprising at least one second base insulating layer, a plurality of second wiring patterns, an upper solder resist layer and a lower solder resist layer covering an upper surface and a lower surface of the at least one second base insulating layer, a plurality of solder resist patches disposed between the lower solder resist layer and the semiconductor chip and having a first width, and a cavity overlapping the semiconductor chip in a vertical direction and having an area less than an area of the semiconductor chip;

a filling member surrounding side surfaces of the plurality of solder resist patches and comprising a filling protrusion filling a space between the support wiring structure and the cover wiring structure and the cavity; and a plurality of connection structures penetrating the filling member and connecting a second portion of the plurality of first wiring patterns and the plurality of second wiring patterns, wherein an upper surface of the filling protrusion and an upper surface of the upper solder resist layer are coplanar.

12. The semiconductor package of claim 11, wherein the filling member contains a filler, and wherein an average diameter of the filler is less than a thickness each of the plurality of solder resist patches.

13. The semiconductor package of claim 12, wherein the plurality of solder resist patches has an interval greater than or equal to twice the average diameter of the filler along first side surfaces of the semiconductor chip, wherein the first side surfaces are opposite to each other, spaced apart from each other and arranged in a row.

14. The semiconductor package of claim 13, wherein an extension length of each of two second side surfaces of the semiconductor chip that connect between the two first side surfaces and are opposite to each other is greater than each of the two first side surfaces.

15. The semiconductor package of claim 11, wherein each of the plurality of solder resist patches is spaced apart from an edge of the semiconductor p by a second width greater than the first width and is in contact with an upper surface of the semiconductor chip.

16. The semiconductor package of claim 11, wherein each of the plurality of solder resist patches overlaps an edge of the semiconductor chip and overhangs from an upper surface of the semiconductor chip.

17. A semiconductor package, comprising:

a first wiring structure;

a second wiring structure, wherein the second wiring structure includes an opening;

a semiconductor chip disposed between the first and second wiring structures, wherein the opening overlaps the semiconductor chip;

a filling portion disposed between the first and second wiring structures, inside the opening and between the semiconductor chip and the second wiring structure, wherein an upper surface of the filling portion and an upper surface of the second wiring structure are coplanar with each other across the opening; and a solder resist pattern disposed between the semiconductor chip and the second wiring structure.

18. The semiconductor package of claim 17, wherein the solder resist pattern is disposed near an edge of the semiconductor chip.

19. The semiconductor package of claim 17, wherein the filling portion is disposed on opposite sides of the solder resist pattern.

20. The semiconductor package of claim 17, wherein a vertical thickness of the solder resist pattern is equal to a vertical thickness of a space between a top surface of the semiconductor chip and a bottom surface of the second wiring structure.

* * * * *